US012652817B2

(12) United States Patent
Yang et al.

(10) Patent No.: US 12,652,817 B2
(45) Date of Patent: Jun. 9, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Junggil Yang, Suwon-si (KR); Taehyun Kim, Suwon-si (KR); Taewon Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 445 days.

(21) Appl. No.: 18/513,740

(22) Filed: Nov. 20, 2023

(65) Prior Publication Data

US 2024/0313097 A1    Sep. 19, 2024

(30) Foreign Application Priority Data

Mar. 17, 2023    (KR) ........................ 10-2023-0035065

(51) Int. Cl.
*H10D 30/43* (2025.01)
*H10D 30/01* (2025.01)
(Continued)

(52) U.S. Cl.
CPC .......... *H10D 30/43* (2025.01); *H10D 30/014* (2025.01); *H10D 30/6729* (2025.01);
(Continued)

(58) Field of Classification Search
CPC .. H10D 30/43; H10D 30/014; H10D 30/6735; H10D 62/121; H10D 62/151;
(Continued)

(56) References Cited

U.S. PATENT DOCUMENTS 7,615,429 B2    11/2009 Kim et al.
10,892,342 B2    1/2021 Chung et al.
(Continued)

FOREIGN PATENT DOCUMENTS

KR       10-0481209       4/2005

OTHER PUBLICATIONS

Jan, et al., "A 14 nm SoC Platform Technology Featuring 2nd Generation Tri-Gate Transistors, 70 nm Gate Pitch, 52 nm Metal Pitch, and 0.0499 um2 SRAM cells, Optimized for Low Power, High Performance and High Density SoC Products", in IEEE Symposium on VLSI Technology Digest of Technical Papers, 2015, 2 pages.

*Primary Examiner* — Wasiul Haider
(74) *Attorney, Agent, or Firm* — Morgan, Lewis & Bockius LLP

(57) ABSTRACT

Disclosed are a semiconductor device and a method of fabricating the same. The semiconductor device includes a substrate including a first region and a second region; an active region on the first region and a peripheral active region on the second region; a channel pattern on the active region; a peripheral channel pattern on the peripheral active region; a first gate electrode on the channel pattern; and a second gate electrode on the peripheral channel pattern. A linewidth of the second gate electrode is larger than a linewidth of the first gate electrode, and a difference in height between the first and second gate electrodes is smaller than about 10 nm, and a top surface of the second gate electrode has a doubly-concave shape.

20 Claims, 49 Drawing Sheets

(51) Int. Cl.

| | |
|---|---|
| *H10D 30/67* | (2025.01) |
| *H10D 62/10* | (2025.01) |
| *H10D 62/13* | (2025.01) |
| *H10D 64/01* | (2025.01) |
| *H10D 64/62* | (2025.01) |

(52) U.S. Cl.
CPC ....... *H10D 30/6735* (2025.01); *H10D 62/121* (2025.01); *H10D 62/151* (2025.01); *H10D 64/017* (2025.01); *H10D 64/018* (2025.01); *H10D 64/62* (2025.01)

(58) Field of Classification Search
CPC ............... H10D 84/83; H10D 30/6757; H10D 84/0142; H10D 84/014; H10D 64/512–518; H10D 64/519; H10D 89/10; H10D 89/00
See application file for complete search history.

(56) References Cited

U.S. PATENT DOCUMENTS

| | | | |
|---|---|---|---|
| 11,081,404 | B2 | 8/2021 | Zhang et al. |
| 11,127,832 | B2 | 9/2021 | Cheng et al. |
| 11,295,989 | B2 | 4/2022 | Cheng |
| 11,362,187 | B2 | 6/2022 | Kim et al. |
| 2015/0372104 | A1 | 12/2015 | Liu et al. |
| 2017/0236821 | A1 | 8/2017 | Kim et al. |
| 2021/0167214 | A1 | 6/2021 | Kim et al. |
| 2021/0384313 | A1 | 12/2021 | Cheng |
| 2022/0173053 | A1 | 6/2022 | Park et al. |
| 2022/0320284 | A1 | 10/2022 | Chen et al. |
| 2023/0031546 | A1 | 2/2023 | Park et al. |
| 2023/0039627 | A1 | 2/2023 | Kao |
| 2024/0072156 | A1* | 2/2024 | Huang ................. H10D 64/015 |

* cited by examiner

FIG. 4

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2023-0035065, filed on Mar. 17, 2023, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

A semiconductor device may include an integrated circuit, which is composed of metal oxide semiconductor field effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high-performance semiconductor devices.

SUMMARY

An embodiment of the inventive concept provides a semiconductor device with improved reliability.

An embodiment of the inventive concept provides a method of fabricating a semiconductor device with improved reliability.

According to an embodiment of the inventive concept, a semiconductor device may include a substrate including a first region and a second region, an active region on the first region and a peripheral active region on the second region, a channel pattern on the active region, the channel pattern including a plurality of first semiconductor patterns, which are stacked to be spaced apart from each other, a peripheral channel pattern on the peripheral active region, the peripheral channel pattern including a plurality of second semiconductor patterns, which are stacked to be spaced apart from each other, a gate electrode on the channel pattern, the gate electrode including a first inner electrode between the first semiconductor patterns and a first outer electrode on the uppermost one of the first semiconductor patterns, and a peripheral gate electrode on the peripheral channel pattern. The peripheral gate electrode may include a second inner electrode between the second semiconductor patterns and a second outer electrode on the uppermost one of the second semiconductor patterns, and a linewidth of the second outer electrode may be larger than a linewidth of the first outer electrode. An edge portion of a top surface of the first outer electrode may have a first height, an edge portion of a top surface of the second outer electrode may have a second height. A difference between the second height and the first height may be smaller than about 10 nm, and the top surface of the second outer electrode may have a doubly-concave shape.

According to an embodiment of the inventive concept, a semiconductor device may include a substrate including a peripheral active region, a peripheral channel pattern on the peripheral active region, the peripheral channel pattern including a plurality of semiconductor patterns, which are stacked to be spaced apart from each other, and a peripheral gate electrode on the peripheral channel pattern. The peripheral gate electrode may include an inner electrode between the semiconductor patterns and an outer electrode on the uppermost one of the semiconductor patterns. A linewidth of the outer electrode may be in a range from about 50 nm to about 100 nm. An edge portion of a top surface of the outer electrode may have a first height, a center portion of the top surface of the outer electrode may have a second height, and the top surface of the outer electrode may have a third height, between the center and edge portions. The first height may be larger than the third height, and the second height may be larger than the third height. A difference between the first height and the second height may be smaller than about 10 nm.

According to an embodiment of the inventive concept, a semiconductor device may include a substrate including a peripheral active region, a device isolation layer filling a trench defining the peripheral active region, a peripheral channel pattern on the peripheral active region, the peripheral channel pattern including a plurality of semiconductor patterns, which are stacked to be spaced apart from each other, a peripheral source/drain pattern provided on the peripheral active region and connected to the semiconductor patterns, a peripheral gate electrode on the peripheral channel pattern, the peripheral gate electrode including an inner electrode between the semiconductor patterns and an outer electrode on the uppermost semiconductor pattern of the semiconductor patterns, a gate insulating layer between the peripheral channel pattern and the peripheral gate electrode, a gate spacer on a side surface of the outer electrode, a gate capping pattern on a top surface of the outer electrode, an active contact coupled to the peripheral source/drain pattern, a gate contact coupled to the peripheral gate electrode, and a first metal layer on the active contact and the gate contact. Interconnection lines in the first metal layer may be electrically connected to the active contact and the gate contact, respectively, and a linewidth of the outer electrode may be in a range from about 50 nm to about 100 nm. An edge portion of the top surface of the outer electrode may have a first height in a range from about 20 nm to about 40 nm, and the top surface of the outer electrode may have a doubly-concave shape.

BRIEF DESCRIPTION OF THE DRAWINGS

FIG. 4 is a plan view illustrating a semiconductor device according to an embodiment of the inventive concept.

DETAILED DESCRIPTION

Figure 1:
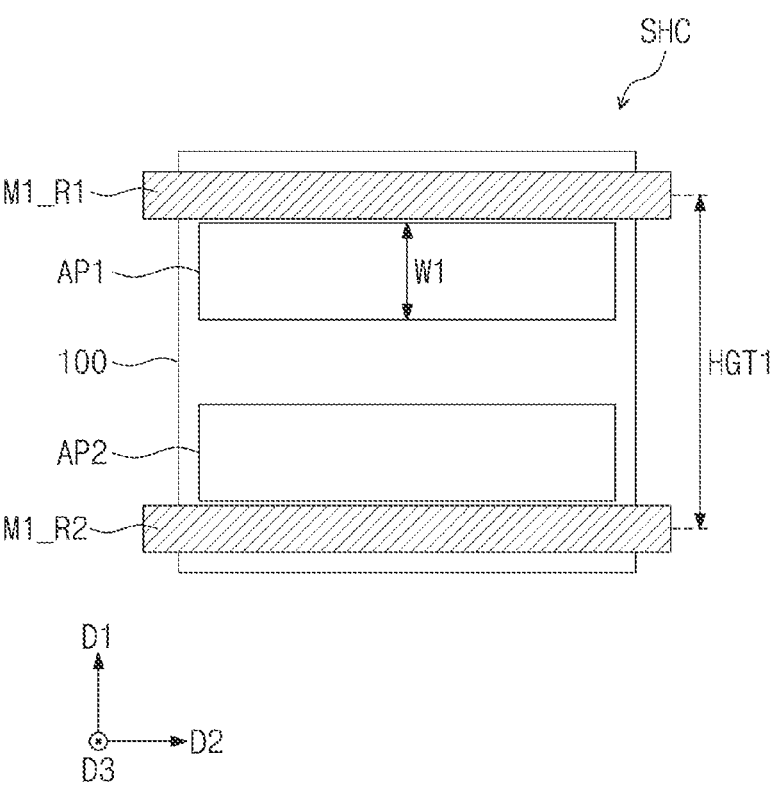
FIGS. 1 to 3 are conceptual diagrams illustrating logic cells of a semiconductor device according to an embodiment of the inventive concept.
Figure 2:
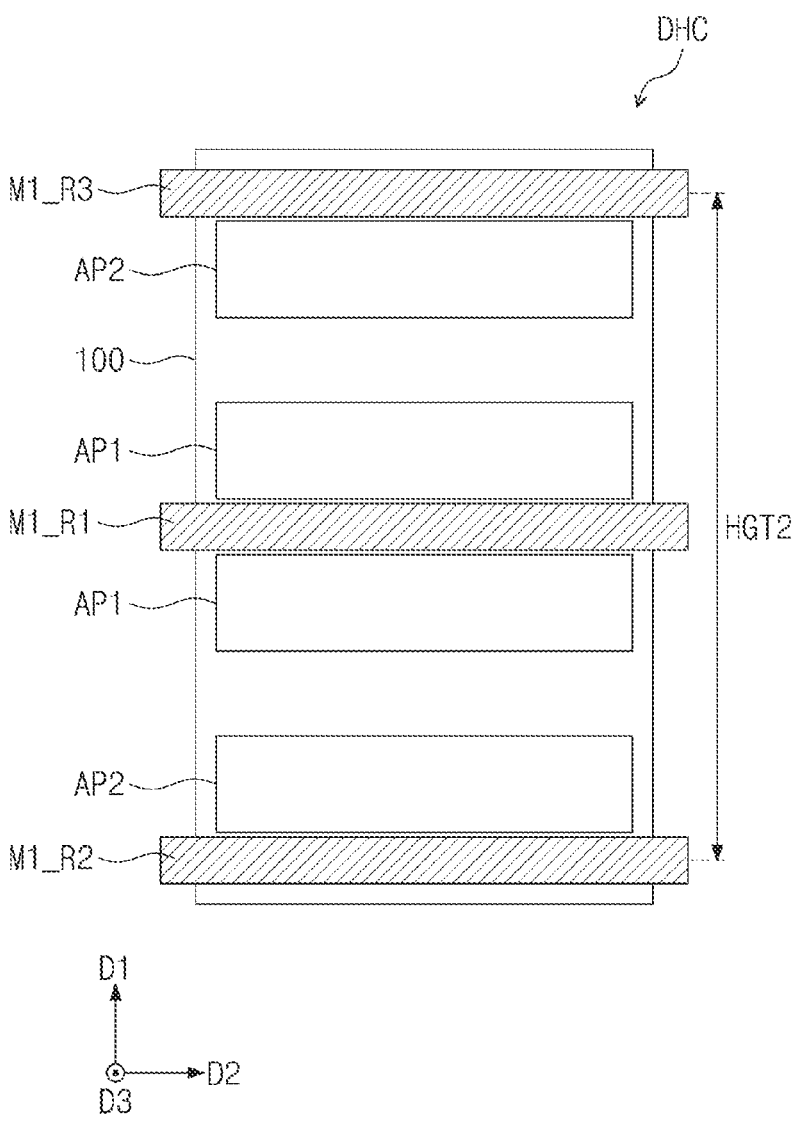
Figure 3:
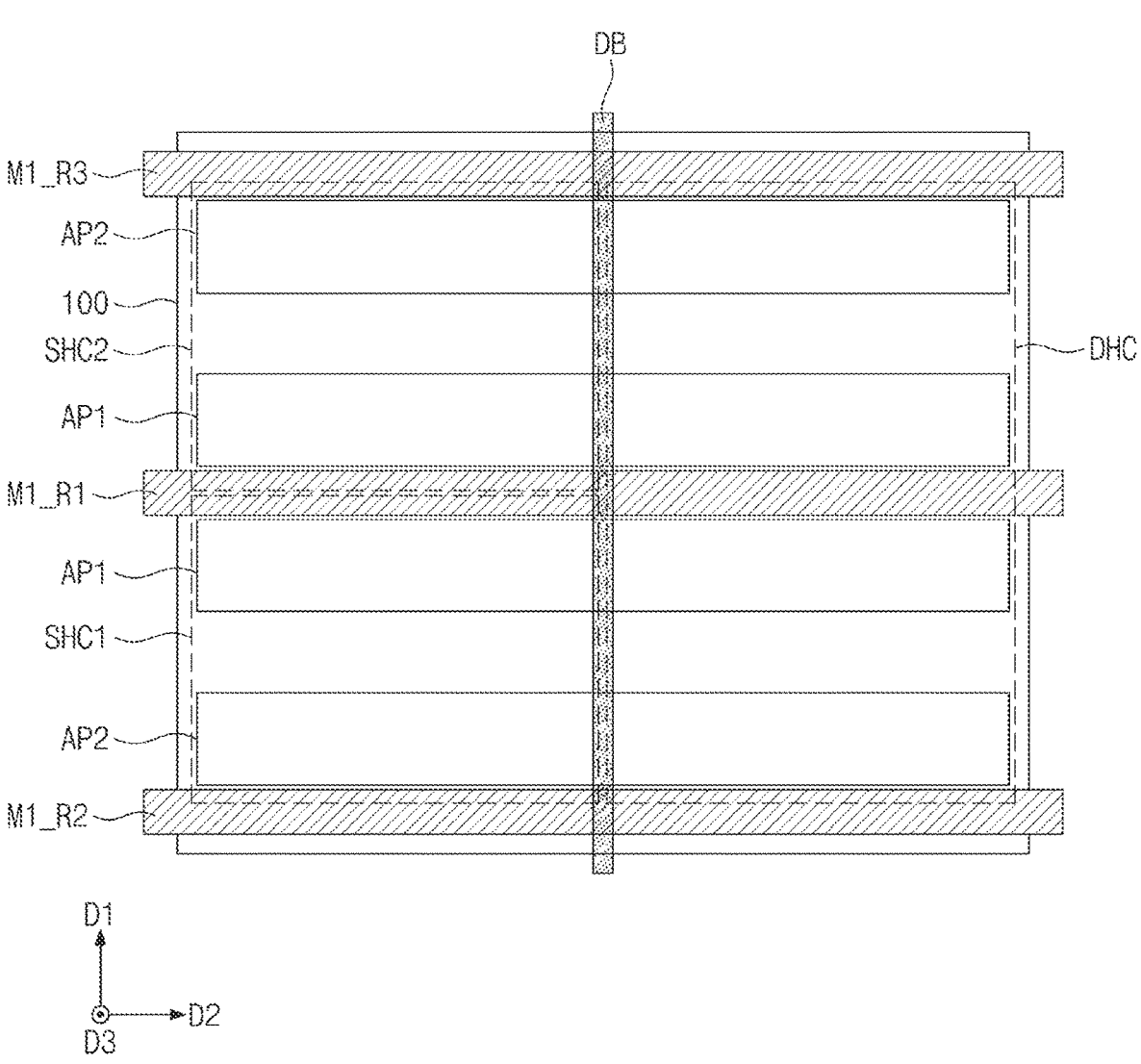

FIGS. 1 to 3 are conceptual diagrams illustrating logic cells of a semiconductor device according to an embodiment of the inventive concept.

Referring to FIG. 1, a single height cell SHC may be provided. In various embodiments, a first power line M1_R1 and a second power line M1_R2 may be provided on a substrate 100. The first power line M1_R1 may be a conduction path, to which a source voltage (VSS) (e.g., a ground voltage) is provided. The second power line M1_R2 may be a conduction path, to which a drain voltage (VDD) (e.g., a power voltage) is provided.

The single height cell SHC may be defined between the first power line M1_R1 and the second power line M1_R2. The single height cell SHC may include one first active region AP1 and one second active region AP2 on the substrate 100, where the first active region AP1 may be spaced apart from the second active region AP2. An intervening portion of the substrate 100 can be between the first active region AP1 and the second active region AP2. One of the first and second active regions AP1 and AP2 may be a PMOSFET region, and the other may be an NMOSFET region. In other words, the single height cell SHC may have a CMOS structure provided between the first and second power lines M1_R1 and M1_R2.

Each of the first and second active regions AP1 and AP2 may have a first width W1 in a first direction D1. A length of the single height cell SHC in the first direction D1 may be defined as a first height HGT1. The first height HGT1 may be substantially equal to a distance (e.g., pitch) between the first power line M1_R1 and the second power line M1_R2.

The single height cell SHC may constitute a single logic cell. In the present specification, the logic cell may mean a logic component (e.g., AND, OR, XOR, XNOR, inverter, and so forth), which is configured to execute a specific function. In other words, the logic cell may include transistors constituting the logic component and interconnection lines connecting the transistors to each other.

Referring to FIG. 2, a double height cell DHC may be provided. In various embodiments, a first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage (VSS) is provided.

The double height cell DHC may be defined between the second power line M1_R2 and the third power line M1_R3. The double height cell DHC may include a pair of first active regions AP1 and a pair of second active regions AP2, where a first active region AP1 and a second active region AP2 can be between each adjacent pair of power lines.

One of the second active region AP2 may be placed adjacent to the second power line M1_R2, where the second active region AP2 is between the first active region AP1 and the second power line M1_R2. The other second active region AP2 may be placed adjacent to the third power line M1_R3, where the second active region AP2 is between the first active region AP1 and the third power line M1_R3. The pair of first active regions AP1 may both be placed adjacent to the first power line M1_R1. When viewed in a plan view, the first power line M1_R1 may be disposed between the pair of first active regions AP1.

A length of the double height cell DHC in the first direction D1 may be defined as a second height HGT2. The second height HGT2 may be about two times the first height HGT1 of FIG. 1. The pair of first active regions AP1 of the double height cell DHC may be combined to serve as a single active region.

In an embodiment, the double height cell DHC shown in FIG. 2 may also be described and referred to as a multi-height cell, where additional active regions and power lines can be included in the multi-height cell. For example, the multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. An active region of the double height cell DHC may be electrically disconnected from an active region of each of the first and second single height cells SHC1 and SHC2 by the division structure DB.

Figure 4:
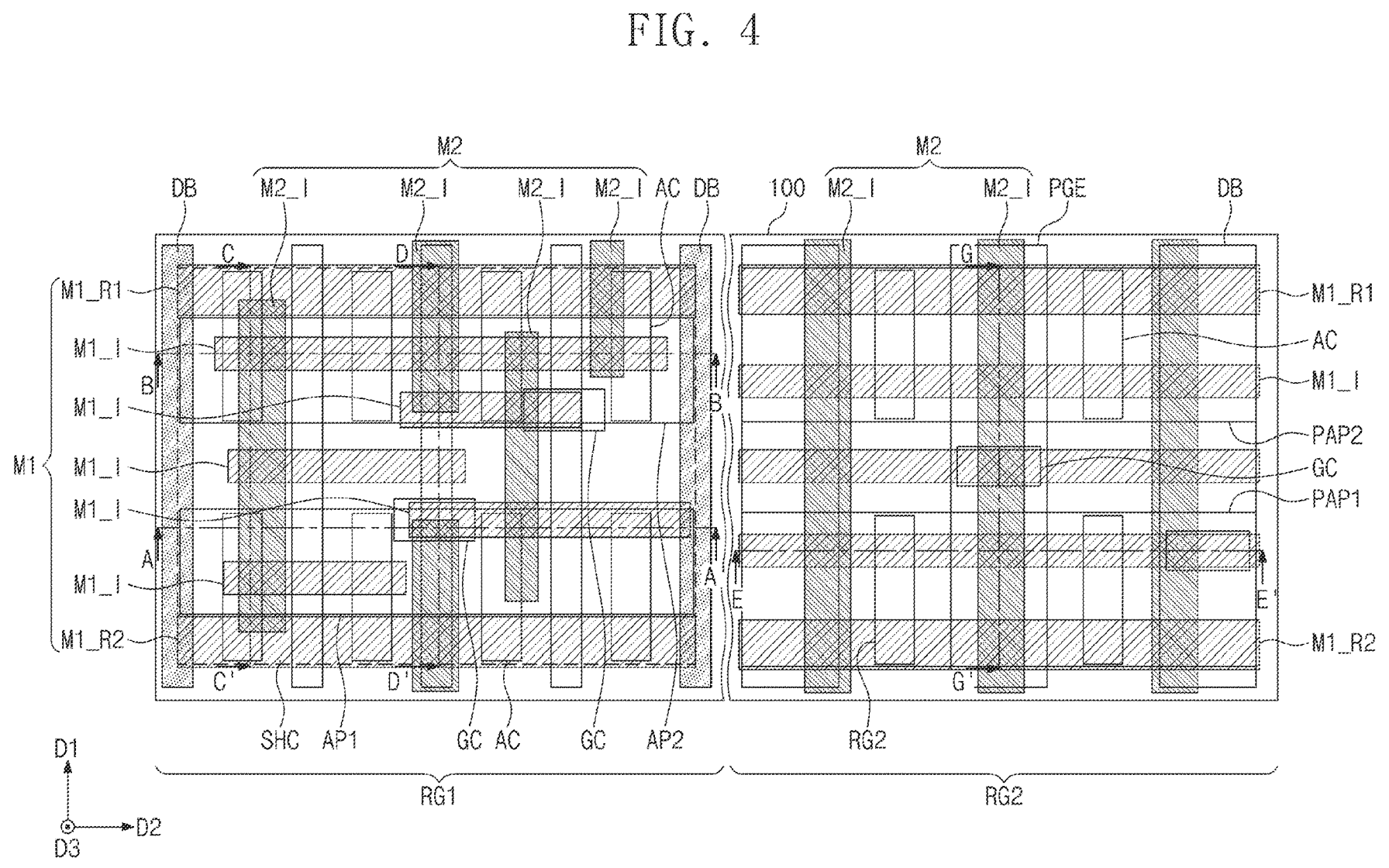
Figure 5A:
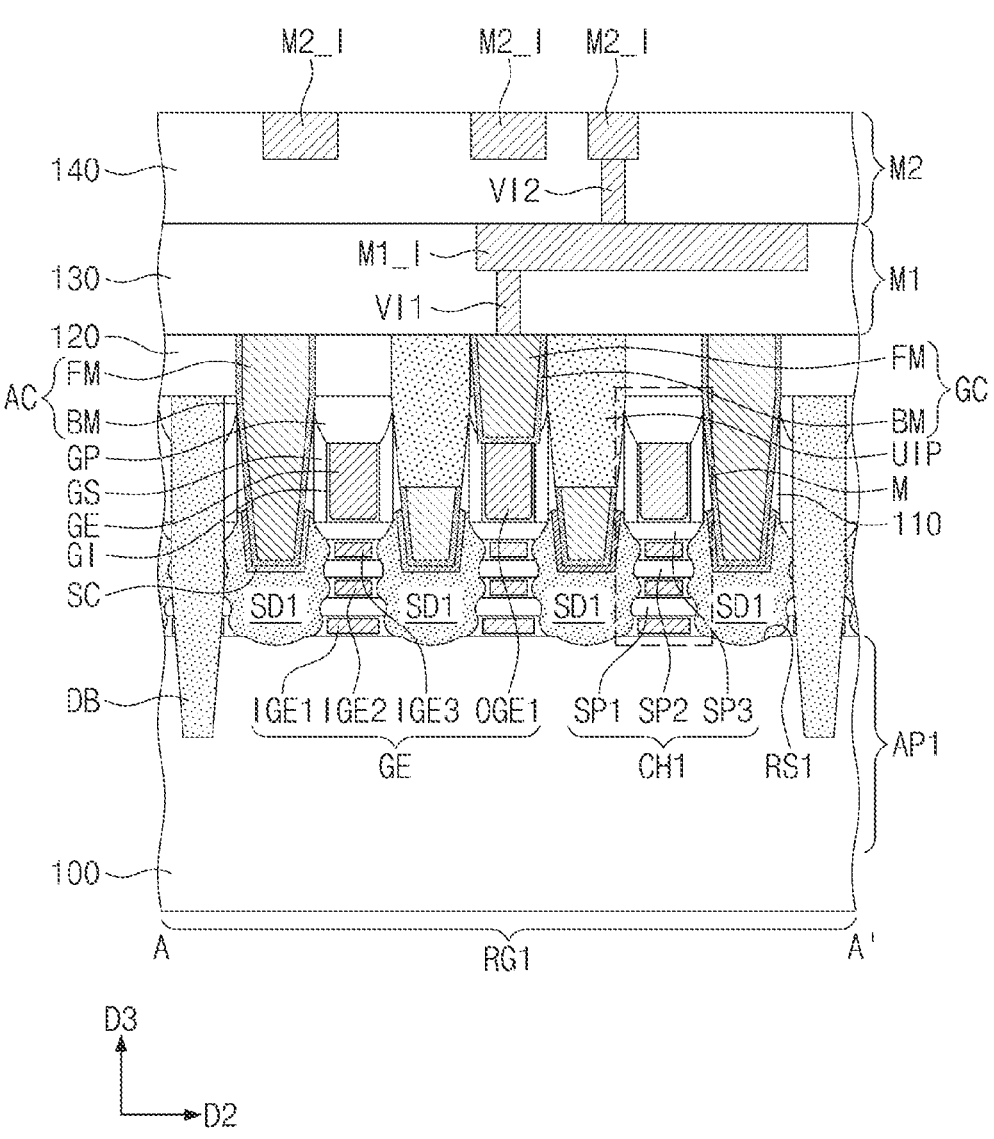
FIGS. 5A to 5E are sectional views taken along lines A-A', B-B', C-C', D-D', and E-E' of FIG. 4, respectively.
Figure 5B:
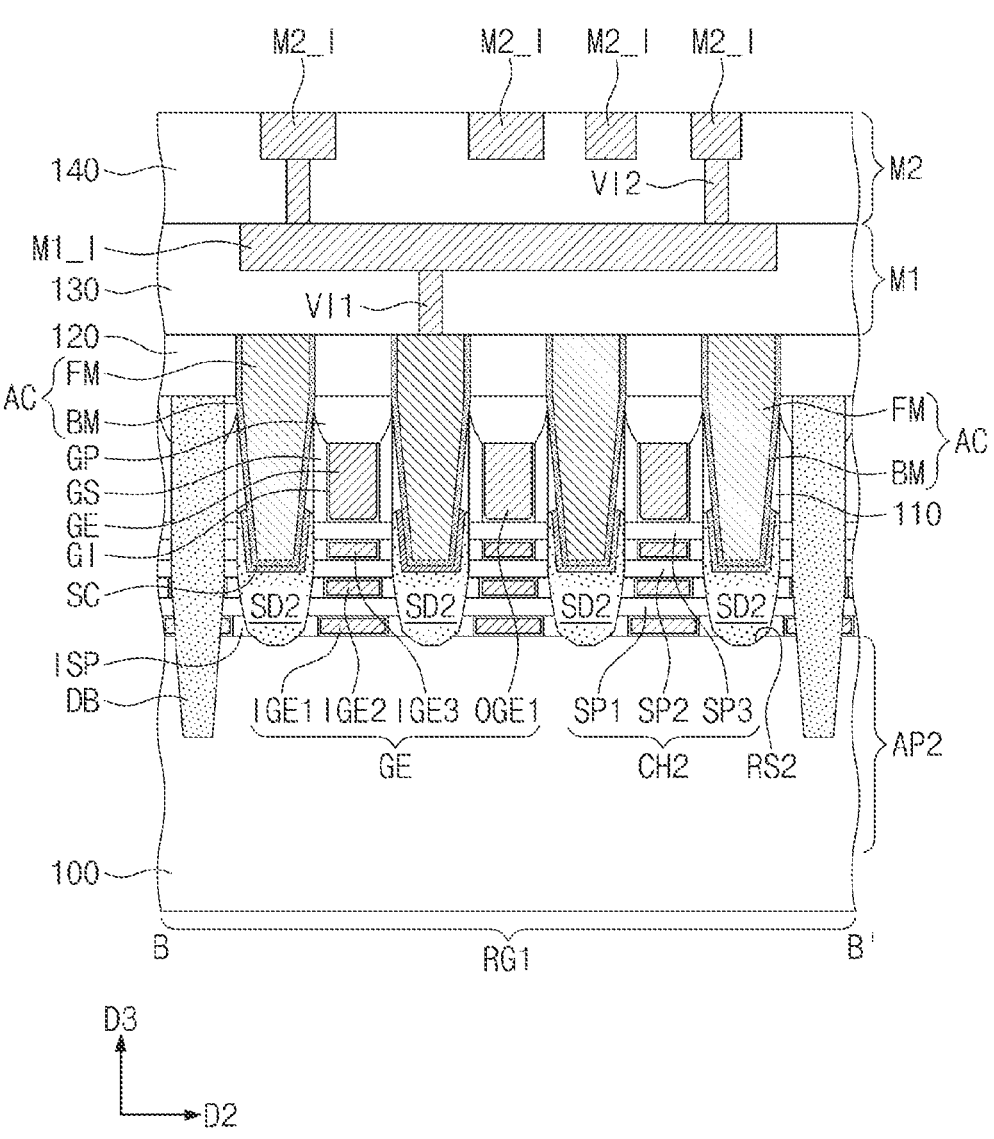

FIG. 4 is a plan view illustrating a semiconductor device according to an embodiment of the inventive concept. FIGS. 5A to 5E are sectional views taken along lines A-A', B-B', C-C', D-D', and E-E' of FIG. 4, respectively. FIG. 6A is an enlarged sectional view illustrating a portion 'M' of FIG. 5A. FIG. 6B is an enlarged sectional view illustrating a portion 'N' of FIG. 5E.

Referring to FIG. 4, the substrate 100 may be provided and may include a first region RG1 and a second region RG2. The first and second regions RG1 and RG2 may be two regions, which are provided in a logic die and are spaced apart from each other. The substrate 100 may be a semiconductor substrate, which is formed of silicon, germanium, silicon germanium, or the like, or a compound semiconductor substrate. In an embodiment, the substrate 100 may be a silicon wafer.

In an embodiment, the first region RG1 may be a cell region, in which a logic cell constituting a logic circuit is disposed. As an example, the single height cell SHC previously described with reference to FIG. 1 may be provided in the first region RG1.

In an embodiment, the second region RG2 may be a peripheral region, in which transistors constituting a processor core or I/O terminals are disposed. For example, the second region RG2 may be a core/peripheral region of a logic die. The second region RG2 may include a long gate transistor (or a long channel transistor) whose gate length (i.e., channel length) is relatively long compared to the gate length (i.e., channel length) of a transistor in the first region RG1. The transistor in the second region RG2 may be operated under a high power condition, compared with the transistor in the first region RG1.

Hereinafter, a three-dimensional transistor in the first region RG1 will be described in more detail with reference to FIGS. 4 and 5A to 5D. The single height cell SHC may include the first active region AP1 and the second active region AP2. The first and second active regions AP1 and AP2 may be spaced apart from each other in the first direction D1. For example, the first active region AP1 may be a PMOSFET region, and the second active region AP2 may be an NMOSFET region.

The first and second active regions AP1 and AP2 may be defined by a trench TR, which is formed in an upper portion of the substrate 100. The first and second active regions AP1 and AP2 may be extended in the second direction D2. The first and second active regions AP1 and AP2 may include upper portions of the substrate 100, which are vertically extended and have a protruding shape.

Figure 5C:
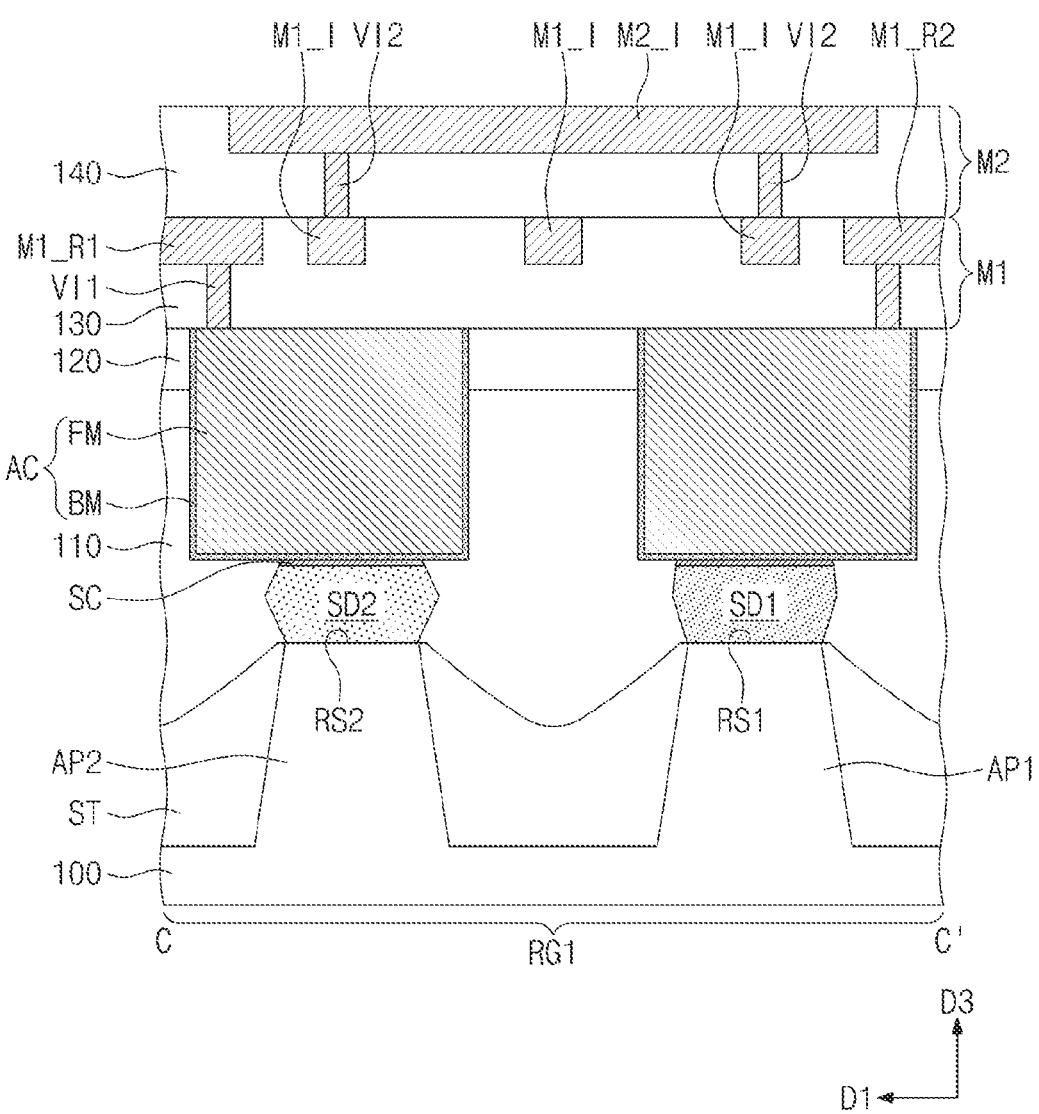
Figure 6A:
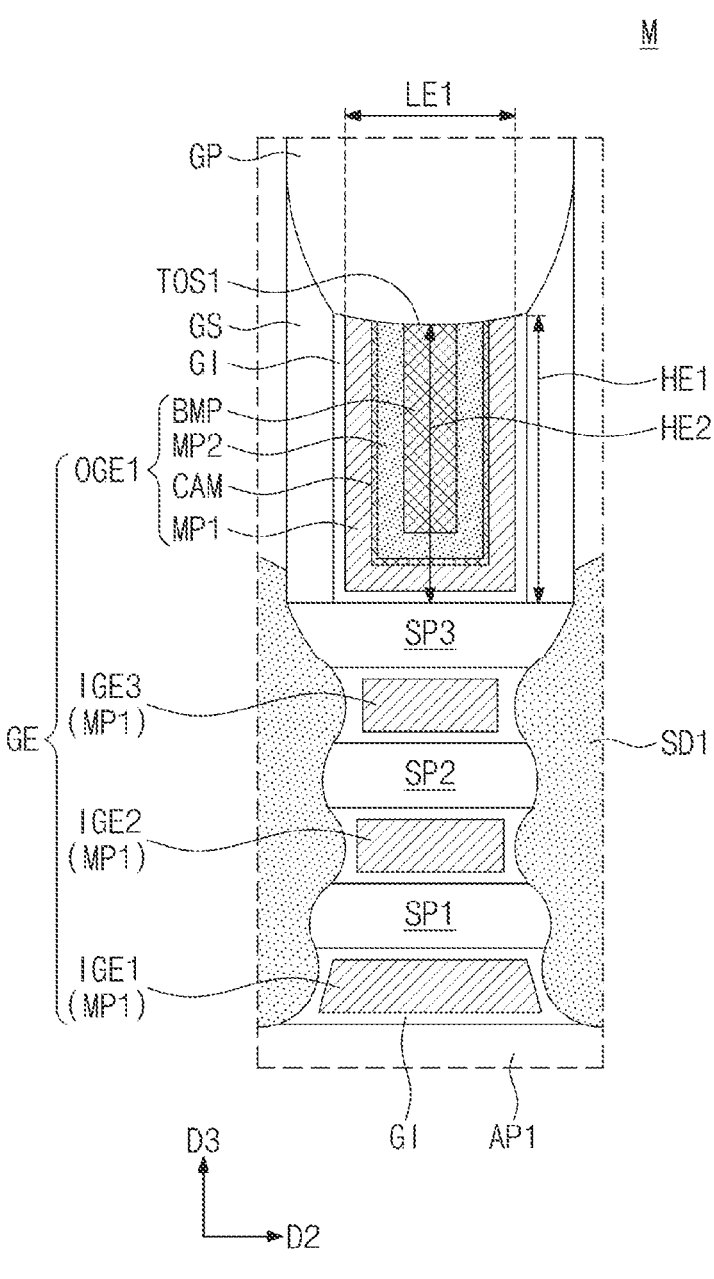
FIG. 6A is an enlarged sectional view illustrating a portion 'M' of FIG. 5A.
Figure 6B:
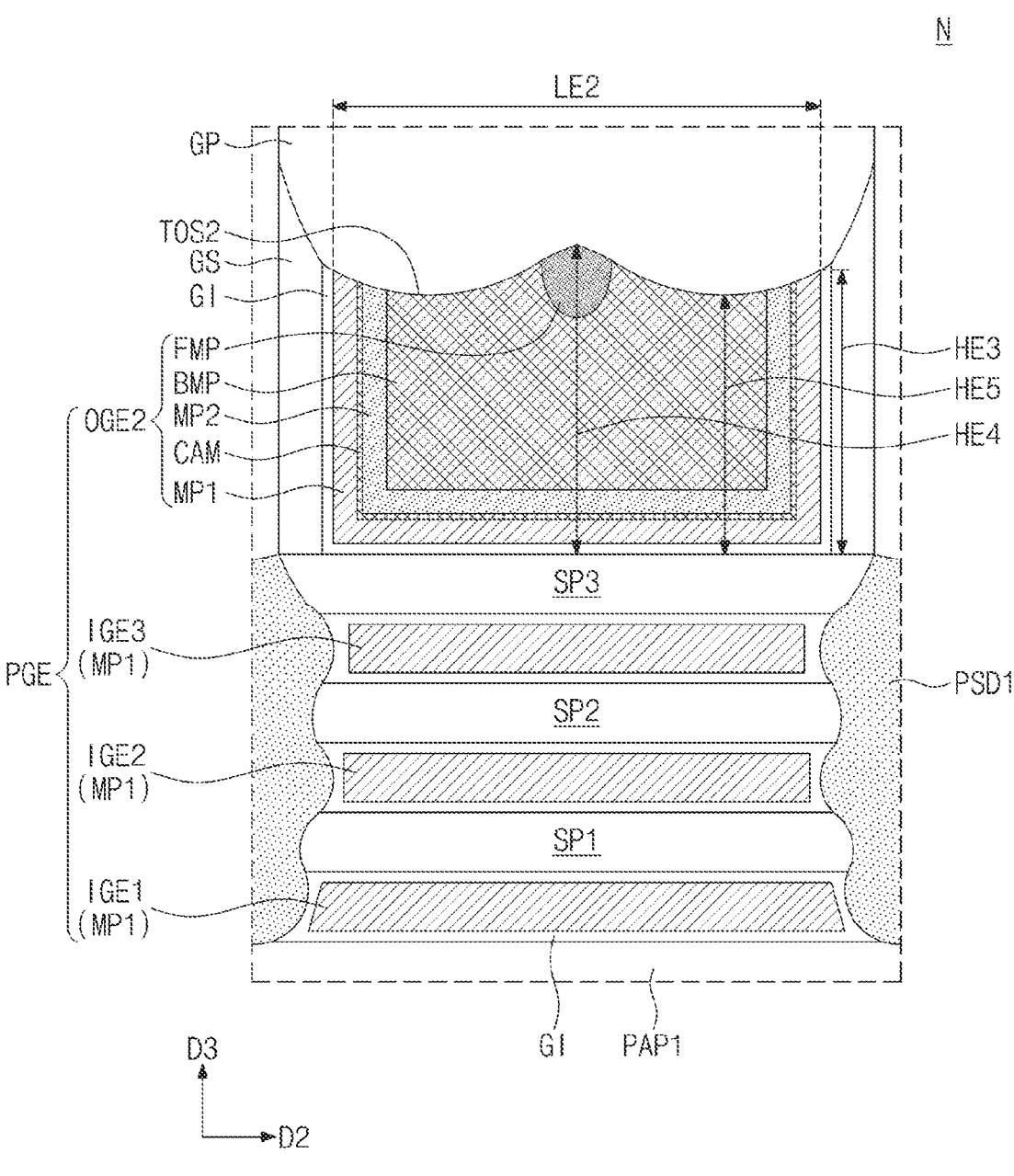
FIG. 6B is an enlarged sectional view illustrating a portion 'N' of FIG. 5E.

A device isolation layer ST may be provided to fill the trench TR, as shown in FIG. 5C. The device isolation layer ST may include a silicon oxide layer. The device isolation layer ST may not cover first and second channel patterns CH1 and CH2, which will be described below.

A first channel pattern CH1 and a second channel pattern CH2 may be provided on the first active region AP1 and the second active region AP2, respectively. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3). The third semiconductor pattern SP3 may be the uppermost semiconductor pattern of the first to third semiconductor patterns SP1, SP2, and SP3, where the third semiconductor pattern SP3 is farthest from the substrate 100.

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon (more specifically, single crystal silicon). In an embodiment, the first to third semiconductor patterns SP1, SP2, and SP3 may be a stack of nanosheets.

A plurality of first source/drain patterns SD1 may be provided on the first active region AP1. A plurality of first recesses RS1 may be formed in an upper portion of the first active region AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1, where a first source/drain pattern SD1 is on each of opposite sides of the first channel pattern CH1. In other words, each pair of the first source/drain patterns SD1 may be connected to each other by the stacked first to third semiconductor patterns SP1, SP2, and SP3.

A plurality of second source/drain patterns SD2 may be provided on the second active region AP2. A plurality of second recesses RS2 may be formed in an upper portion of the second active region AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2, where a second source/drain patterns SD2 is on each of opposite sides of the second channel pattern CH2. In other words, the pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3. In an embodiment, a top surface of at least one of the first and second source/drain patterns SD1 and SD2 may be located at substantially the same level as the top surface of the third semiconductor pattern SP3. The first and second source/drain patterns SD1 and SD2 can cover and be in electrical contact with the end walls of the third semiconductor pattern SP3.

In an embodiment, the first source/drain patterns SD1 may include a semiconductor material (e.g., SiGe) whose lattice constant is larger than a lattice constant of a semiconductor material (e.g., Si) of the substrate 100. Accordingly, each pair of the first source/drain patterns SD1 may exert a compressive stress on the first channel pattern CH1 therebetween. The second source/drain patterns SD2 may be formed of or include the same semiconductor element (e.g., Si) as the substrate 100.

In an embodiment, a side surface of the first source/drain pattern SD1 may have an uneven or embossing shape. For example, the side surface of the first source/drain pattern SD1 may have a wavy profile. The side surface of the first source/drain pattern SD1 may protrude toward first to third inner electrodes IGE1, IGE2, and IGE3 of a gate electrode GE to be described below.

Figure 5D:
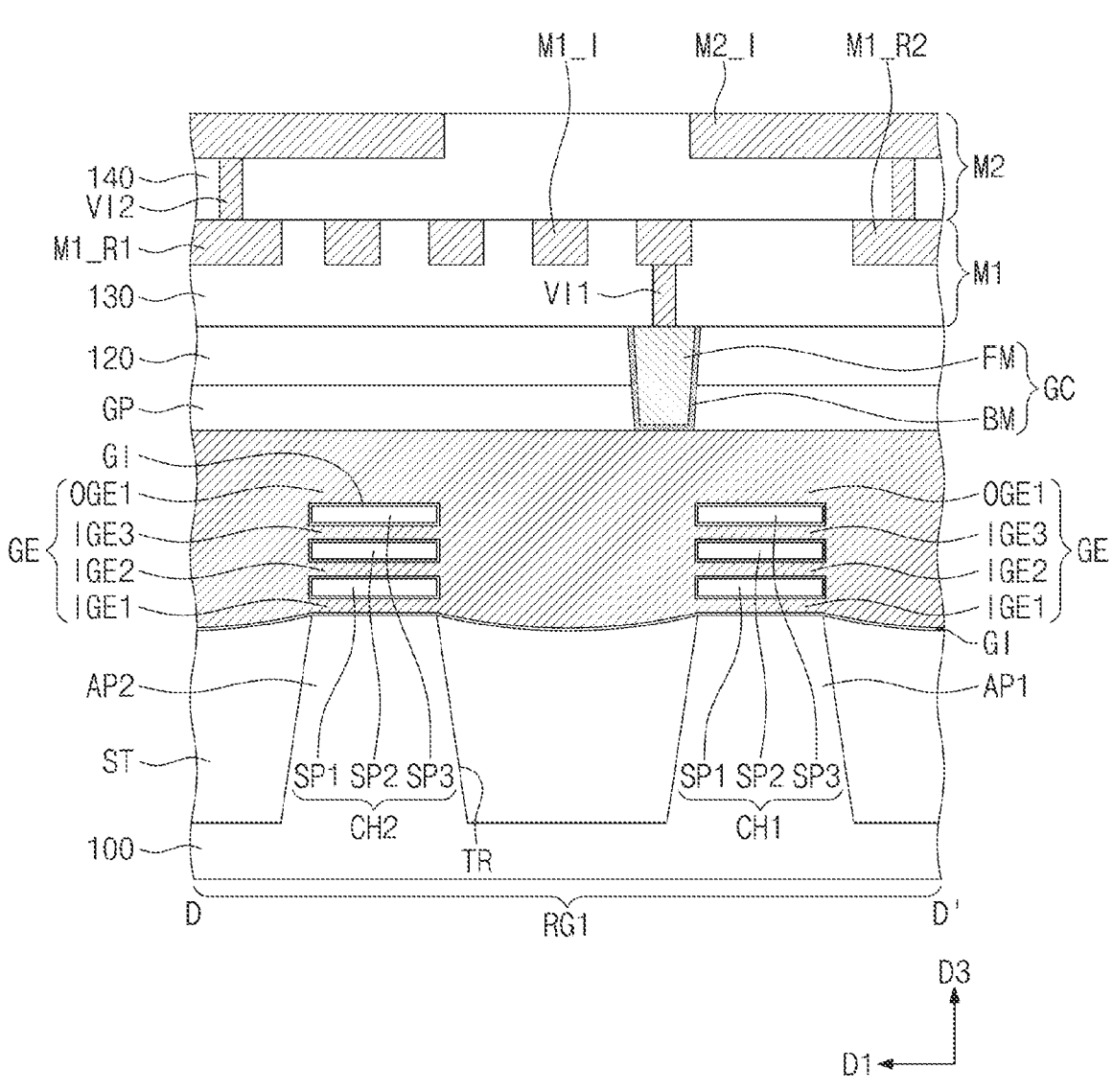

Gate electrodes GE may be provided on the first region RG1 to cross the first and second channel patterns CH1 and CH2 and extend in the first direction D1 (e.g., see FIG. 5D). Each of the gate electrodes GE may be vertically overlapped with the first and second channel patterns CH1 and CH2. The gate electrodes GE may be arranged at a first pitch in the second direction D2 (e.g., see FIGS. 5A and 5B).

Referring back to FIG. 5D, the gate electrode GE may be provided on top, bottom, and opposite side surfaces of each of the first to third semiconductor patterns SP1, SP2, and SP3, where the gate electrode GE can wrap around the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

Referring back to FIG. 4 and FIGS. 5A to 5D, the gate electrode GE may include a first inner electrode IGE1 between the active region AP1 or AP2 and the first semiconductor pattern SP1, a second inner electrode IGE2 between the first semiconductor pattern SP1 and the second semiconductor pattern SP2, and a third inner electrode IGE3 between the second semiconductor pattern SP2 and the third semiconductor pattern SP3. The third inner electrode IGE3 may be the uppermost inner electrode of the first to third inner electrodes IGE1, IGE2, and IGE3, where the third semiconductor pattern SP3 is farthest from the substrate 100. The gate electrode GE may further include a first outer electrode OGE1 on the first to third inner electrodes IGE1, IGE2, and IGE3. The first outer electrode OGE1 may be provided on the third semiconductor pattern SP3. The first outer electrode OGE1 can be contiguous with the first to third inner electrodes IGE1, IGE2, and IGE3 to form the gate electrode GE.

A pair of gate spacers GS may be respectively disposed on opposite side surfaces of the first outer electrode OGE1. The gate spacers GS may be extended along the gate electrode GE and in the first direction D1. The gate spacers GS may have top surfaces that are higher than a top surface of the first outer electrode OGE1. The gate spacers GS may be formed of or include at least one of SiCN, SiCON, or SiN. In an embodiment, the gate spacers GS may have a multi-layered structure including at least two layers, each of which is made of SiCN, SiCON, or SiN.

A gate capping pattern GP may be provided on the gate electrode GE and the gate spacers GS. For example, the gate capping pattern GP may cover the top surface of the gate electrode GE and the top surfaces of the gate spacers GS. The gate capping pattern GP may be extended along the gate electrode GE in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the channel pattern CH1 or CH2 (e.g., see FIGS. 5A and 5B). The gate insulating layer GI may cover top, bottom, and opposite side surfaces of each of the first to third semiconductor patterns SP1, SP2, and SP3. The gate insulating layer GI may cover the top surface of the device isolation layer ST below the gate electrode GE (e.g., see FIG. 5D).

In an embodiment, the gate insulating layer GI may include a silicon oxide layer, a silicon oxynitride layer, and/or a high-k dielectric layer. For example, the gate insulating layer GI may have a structure, in which an interface layer and a high-k dielectric layer are stacked. The interface layer may include a silicon oxide layer or a silicon oxynitride layer. The high-k dielectric layer may be formed of or include at least one of high-k dielectric materials whose dielectric constants are higher than that of silicon oxide. As an example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may be in a range from about 3 to about 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may be in a range from about 2 atomic percent (at %) to about 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may be in a range from about 1 at % to about 7 at %. In the case where the dopants are zirconium (Zr), a content of zirconium in the ferroelectric layer may be in a range from about 50 at % to about 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness in a range from about 0.5 to about 10 nm, but the inventive concept is not limited to this example. Since a thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIG. 5B, inner spacers ISP may be provided on the second active region AP2 and may be interposed between the first to third inner electrodes IGE1, IGE2, and IGE3 of the gate electrode GE and the second source/drain pattern SD2. Each of the first to third inner electrodes IGE1, IGE2, and IGE3 may be spaced apart from the second source/drain pattern SD2 with the inner spacer ISP interposed therebetween. The inner spacer ISP may prevent a leakage current from the gate electrode GE, where the inner spacer ISP can be electrically insulating.

Referring back to FIG. 4 and FIGS. 5A to 5D, a first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be provided on the first interlayer insulating layer 110 to cover the gate capping pattern GP. In an embodiment, at least one of the first and second interlayer insulating layers 110 and 120 may include a silicon oxide layer.

A pair of division structures DB may be provided at both sides of the single height cell SHC. The division structure DB may be extended in the first direction D1 to be parallel to the gate electrodes GE. A pitch between the division structure DB and the gate electrode GE, which are adjacent to each other, may be equal to the first pitch between gate electrodes GE.

The division structure DB may penetrate the gate capping pattern GP and the gate electrode GE and may be extended into the active region AP1 or AP2. The division structure DB may be provided to penetrate the channel pattern CH1 or CH2. The division structure DB may separate the active region AP1 or AP2 of the single height cell SHC from an active region of another logic cell (e.g., see FIG. 3).

Active contacts AC may be provided to penetrate the first and second interlayer insulating layers 110 and 120 and may be electrically connected to the first and second source/drain patterns SD1 and SD2, respectively (e.g., see FIG. 5A to 5C). A pair of the active contacts AC may be respectively provided at both sides of the gate electrode GE (e.g., see FIGS. 5A and 5B). When viewed in a plan view, the active contact AC may be a bar-shaped pattern extended in the first direction D1. The active contacts AC may include a conductive pattern FM and a barrier pattern BM enclosing the conductive pattern FM.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

A metal-semiconductor compound layer SC (e.g., a silicide layer) may be interposed between the active contact AC and the source/drain pattern SD1 or SD2. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

A gate contact GC may be provided to penetrate the second interlayer insulating layer 120 and the gate capping pattern GP and may be electrically connected to the gate electrode GE. In an embodiment, an upper region of each of the active contacts AC adjacent to the gate contact GC may be filled with an upper insulating pattern UIP, as shown in FIG. 5A. Accordingly, it may be possible to prevent a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CON), or platinum nitride (PtN).

A first metal layer M1 may be provided in a third interlayer insulating layer 130. For example, the first metal layer M1 may include the first power line M1_R1, the second power line M1_R2, and first interconnection lines M1_I (e.g., see FIG. 5C). The interconnection lines M1_R1, M1_R2, and M1_I of the first metal layer M1 may be extended in the second direction D2 and parallel to each other.

The first and second power lines M1_R1 and M1_R2 may be provided on the borders of the single height cell SHC, respectively. Each of the first and second power lines M1_R1 and M1_R2 may be extended along the border and in the second direction D2.

The first interconnection lines M1_I of the first metal layer M1 may be disposed between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively provided below the interconnection lines M1_R1, M1_R2, and M1_I of the first metal layer M1. The active contact AC and the interconnection line of the first metal layer M1 may be electrically connected to each other through the first via VI1 (e.g., see FIG. 5C). The gate contact GC and the interconnection line of the first metal layer M1 may be electrically connected to each other through the first via VI1 (e.g., see FIG. 5D).

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in a fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1 (e.g., see FIG. 5D). In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials (e.g., aluminum, copper, tungsten, ruthenium, molybdenum, and cobalt).

In an embodiment, a plurality of metal layers (e.g., M3, M4, M5, and so forth) may be additionally stacked on the fourth interlayer insulating layer 140. Each of the stacked metal layers may include interconnection lines, which are used as routing paths between cells.

The gate electrode GE on the first active region AP1 will be described in more detail with reference to FIG. 6A. The gate insulating layer GI may cover a surface of each of the first to third semiconductor patterns SP1 to SP3 (e.g., see FIGS. 5D and 6A). The gate insulating layer GI may include an interface layer and a high-k dielectric layer on the interface layer. The interface layer may directly cover the surface of each of the first to third semiconductor patterns SP1, SP2, and SP3. The high-k dielectric layer may be spaced apart from the first to third semiconductor patterns SP1, SP2, and SP3 with the interface layer interposed therebetween. The high-k dielectric layer may be thicker than the interface layer.

The first to third inner electrodes IGE1, IGE2, and IGE3 of the gate electrode GE may be formed of or include the same material. Each of the first to third inner electrodes IGE1, IGE2, and IGE3 may include a first metal pattern MP1. The first metal pattern MP1 may be a first work function metal, which is used to adjust a threshold voltage of a transistor. By adjusting a composition of the first work-function metal, it may be possible to realize a transistor having a desired threshold voltage. As an example, the first work-function metal may be a p-type work-function metal having a relatively high work-function.

The first metal pattern MP1 may be formed of or include at least one of metal nitride materials, metal oxynitride materials, metal oxycarbide materials, or metal oxynitride carbide materials. A metallic element contained in the first metal pattern MP1 may be one that is selected from the group consisting of Ti, Ta, Nb, Al, W, and Mo. In an embodiment, the first metal pattern MP1 may contain aluminum (Al) or silicon (Si). As an example, the first metal pattern MP1 may be formed of or include titanium silicon nitride (TiSiN) or titanium aluminum nitride (TiAlN). The first metal pattern can be a p-type work function metal.

The first outer electrode OGE1 of the gate electrode GE may have a first length LE1 in the second direction D2, where a linewidth of the first outer electrode OGE1 may be the first length LE1. For example, the first length LE1 may be in a range from about 10 nm to about 20 nm. A transistor on the first region RG1 may be a short channel transistor.

The first outer electrode OGE1 may include the first metal pattern MP1, a capping pattern CAM, a second metal pattern MP2, and a barrier metal pattern BMP, which are sequentially stacked. The first metal pattern MP1 may be provided to have substantially the same features as the first metal pattern MP1 of the inner electrode IGE1, IGE1, or IGE3 described above.

The capping pattern CAM may be interposed between the first metal pattern MP1 and the second metal pattern MP2. The second metal pattern MP2 may be provided on the capping pattern CAM and thus may be separated from the first metal pattern MP1 by the capping pattern CAM. The capping pattern CAM may include a metal nitride layer. The capping pattern CAM may be formed of or include at least one metal, which is selected from the group consisting of titanium (Ti), tantalum (Ta), aluminum (Al), tungsten (W) and molybdenum (Mo), and can further include nitrogen (N) to form a metal nitride. For example, the capping pattern CAM may be formed of or include TiN.

The second metal pattern MP2 may include a second work-function metal, which may be used to adjust a threshold voltage of a transistor. By adjusting a composition of the second work-function metal, it may be possible to realize a transistor having a desired threshold voltage. As an example, the second work-function metal may be an n-type work-function metal having a relatively low work-function.

The second metal pattern MP2 may be formed of or include one or more metal carbides. The second metal pattern MP2 may be formed of or include one or more metal carbides that are doped with silicon and/or aluminum and contain silicon and/or aluminum. As an example, the second metal pattern MP2 may be formed of or include aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC). As another example, the second metal pattern MP2 may be formed of or include titanium carbide (TiAlSiC), which is doped with aluminum and silicon, or tantalum carbide (TaAlSiC), which is doped with aluminum and silicon. As an example, the second metal pattern MP2 may be formed of or include aluminum-doped titanium (TiAl). As still another example, the second metal pattern MP2 may be formed of or include a metal nitride doped with silicon and/or aluminum (e.g., aluminum-doped titanium nitride (TiAlN)). The second metal pattern can be an n-type work function metal.

A work-function of the second metal pattern MP2 may be controlled by adjusting a concentration of dopants or impurities (e.g., silicon or aluminum) contained in the second metal pattern MP2. As an example, the concentration of the impurity (e.g., silicon or aluminum) in the second metal pattern MP2 may be in a range from about 0.1 at % to about 25 at %.

The barrier metal pattern BMP may be provided on the second metal pattern MP2. The barrier metal pattern BMP may include a metal nitride layer. The barrier metal pattern BMP may include at least one metallic element, which is selected from the group consisting of titanium (Ti), tantalum (Ta), aluminum (Al), tungsten (W), and molybdenum (Mo), and can further include nitrogen (N) to form a metal nitride. For example, the barrier metal pattern BMP may be formed of or include titanium nitride (TiN).

The barrier metal pattern BMP may be provided to completely fill a remaining empty space of the first outer electrode OGE1 of the gate electrode GE, where the barrier metal pattern BMP can fill the space between opposing sidewalls of the second metal pattern MP2. In other words, the barrier metal pattern BMP may serve as a core of the first outer electrode OGE1.

A top surface TOS1 of the first outer electrode OGE1 of the gate electrode GE may be in direct contact with the gate capping pattern GP. The top surface TOS1 of the first outer electrode OGE1 may have a downwardly concave profile. An edge portion of the top surface TOS1 of the first outer electrode OGE1 may have a first height HE1, where the edge portion can be adjoining the gate spacers GS, and a center portion of the top surface TOS1 of the first outer electrode OGE1 may have a second height HE2. The first height HE1 may be greater than the second height HE2. In an embodiment, the first and second heights HE1 and HE2 may be defined as vertical distances from the top surface of the third semiconductor pattern SP3 to the top surface TOS1 of the first outer electrode OGE1. The first height HE1, for example, may be in a range from about 15 nm to about 25 nm. A ratio HE2/HE1 of the second height HE2 to the first height HE1 may be in a range from about 0.8 to about 1.

Hereinafter, the three-dimensional transistor in the second region RG2 will be described in more detail with reference to FIGS. 4 and 5E. The same features as the transistor in the first region RG1 described with reference to FIGS. 4 and 5A to 5D may be omitted in the following description, for the sake of brevity.

The second region RG2 may include a first peripheral active region PAP1 and a second peripheral active region PAP2 (e.g., see FIG. 4). For example, the first peripheral active region PAP1 may be a PMOSFET region, and the second peripheral active region PAP2 may be an NMOSFET region. The device isolation layer ST may be provided in the trench TR between the first and second peripheral active regions PAP1 and PAP2 (e.g., see FIG. 5C).

Figure 5E:
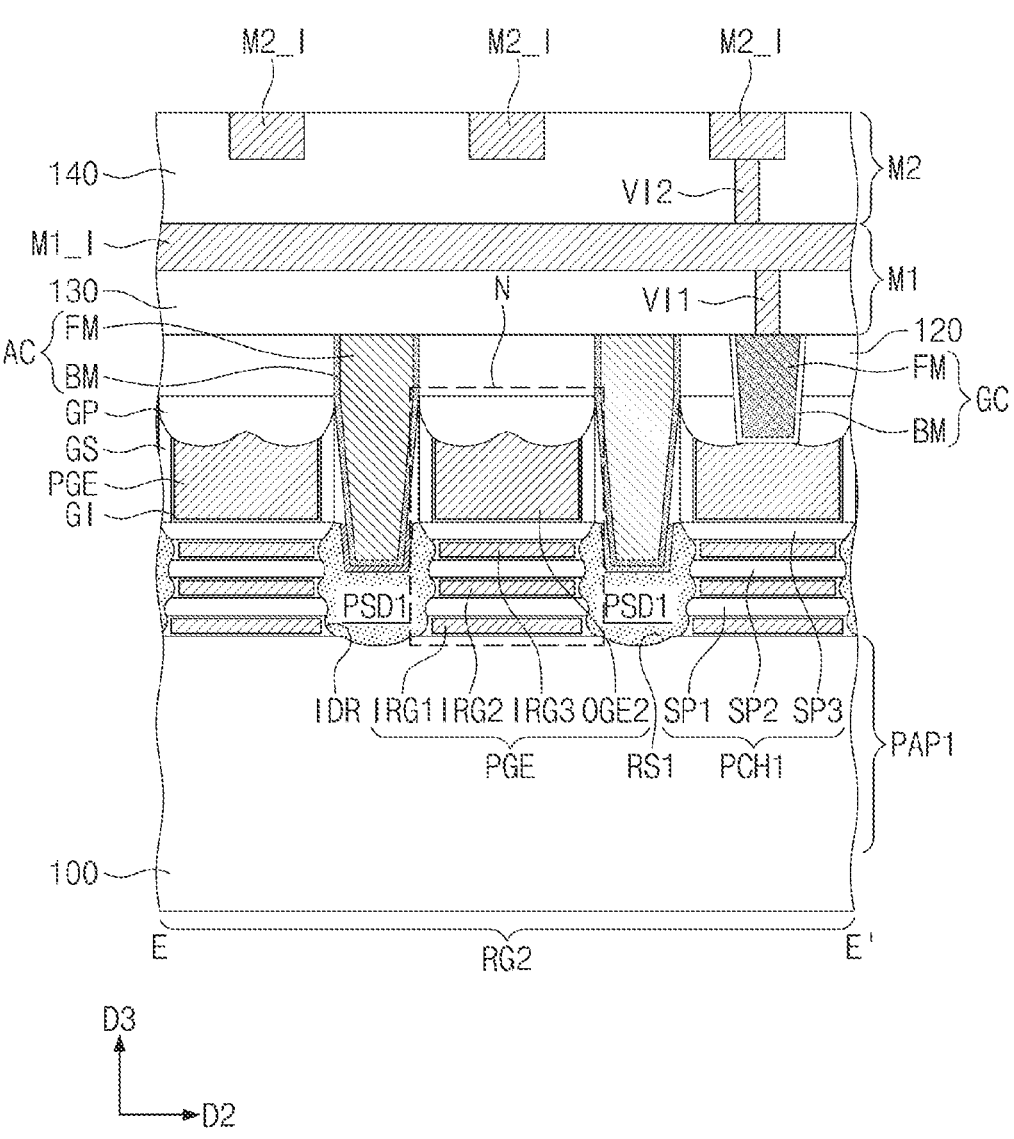

First peripheral channel patterns PCH1 and first peripheral source/drain patterns PSD1 may be provided on the first peripheral active region PAP1 (e.g., see FIG. 5E). Second peripheral channel patterns PCH2 and second peripheral source/drain patterns PSD2 may be provided on the second peripheral active region PAP2. Each of the first and second peripheral channel patterns PCH1 and PCH2 may include nanosheets (e.g., the first to third semiconductor patterns SP1, SP2, and SP3), which are stacked.

Peripheral gate electrodes PGE may be provided on the second region RG2 to cross the first and second peripheral channel patterns PCH1 and PCH2 and extend in the first direction D1. The peripheral gate electrodes PGE may be arranged at a third pitch in the second direction D2. The third pitch may be larger than the first pitch of the gate electrodes GE. Similar to the embodiment of FIG. 5D, the peripheral gate electrode PGE may be a gate electrode of a three-dimensional field effect transistor (e.g., MBCFET or GAAFET) enclosing the semiconductor patterns SP1, SP2, and SP3.

The peripheral gate electrode PGE may include the first inner electrode IGE1 between the peripheral active region PAP1 or PAP2 and the first semiconductor pattern SP1, the second inner electrode IGE2 between the first semiconductor pattern SP1 and the second semiconductor pattern SP2, and the third inner electrode IGE3 between the second semiconductor pattern SP2 and the third semiconductor pattern SP3 (e.g., see FIG. 5E). The peripheral gate electrode PGE may further include a second outer electrode OGE2 provided on the third semiconductor pattern SP3.

The peripheral gate electrode PGE on the first peripheral active region PAP1 will be described in more detail with reference to FIG. 6B. The first to third inner electrodes IGE1, IGE2, and IGE3 of the peripheral gate electrode PGE may be formed of or include the same material. Each of the first to third inner electrodes IGE1, IGE2, and IGE3 may include the first metal pattern MP1.

The second outer electrode OGE2 of the peripheral gate electrode PGE may have a second length LE2 in the second direction D2, where a linewidth of the second outer electrode OGE2 may be the second length LE2. For example, the second length LE2 may be, for example, in a range from about 50 nm to about 100 nm. A transistor on the second region RG2 may be a long channel transistor.

The second outer electrode OGE2 may include the first metal pattern MP1, the capping pattern CAM, the second metal pattern MP2, and the barrier metal pattern BMP, which are sequentially stacked. The first metal pattern MP1, the capping pattern CAM, the second metal pattern MP2, and the barrier metal pattern BMP may be configured to have substantially the same features as those in the embodiment described with reference to the first outer electrode OGE1 in FIG. 6A.

In an embodiment, the second outer electrode OGE2 may further include a fill metal pattern FMP. The fill metal pattern FMP may be provided on the barrier metal pattern BMP. The fill metal pattern FMP may serve as a core of the second outer electrode OGE2. The fill metal pattern FMP may be provided in an upper portion of the second outer electrode OGE2 in a vertical direction and may be provided in a center portion of the second outer electrode OGE2 in a horizontal direction. As an example, the fill metal pattern FMP may be formed of or include at least one of a low resistance metallic material (e.g., tungsten (W), aluminum (Al), titanium (Ti) and tantalum (Ta)).

A top surface TOS2 of the second outer electrode OGE2 of the peripheral gate electrode PGE may be in direct contact with the gate capping pattern GP. The top surface TOS2 of the second outer electrode OGE2 may have a wavy profile. The top surface TOS2 of the second outer electrode OGE2 may have a doubly-concave shape that may resemble a Moustache shape, where two concave portions meet at a center point. The doubly-concave shape can meet at the fill metal pattern FMP.

An edge portion of the top surface TOS2 of the second outer electrode OGE2 may have a third height HE3, and a center portion of the top surface TOS2 of the second outer electrode OGE2 may have a fourth height HE4. The lowermost point of the top surface TOS2 of the second outer electrode OGE2 may have a fifth height HE5. The lowermost point of the top surface TOS2 may be located between the edge portion and the center portion of the top surface TOS2. In an embodiment, the fill metal pattern FMP may be located near the center portion of the top surface TOS2.

The fourth height HE4 may be greater than the third height HE3. The third height HE3 may be greater than the fifth height HE5. In an embodiment, the third height HE3 may be, for example, in a range from about 20 nm to about 40 nm. A ratio HE4/HE3 of the fourth height HE4 to the third height HE3 may be in a range from about 1 to about 1.2. In an embodiment, a difference between the third height HE3 and the fourth height HE4 may be less than about 10 nm.

The third height HE3 may be similar to the first height HE1 of FIG. 6A. In an embodiment, the third height HE3 may be larger than the first height HE1 of FIG. 6A. For example, a difference between the third height HE3 and the first height HE1 may be less than about 10 nm. A ratio HE3/HE1 of the third height HE3 to the first height HE1 may be in a range from about 1 to about 1.5.

According to an embodiment of the inventive concept, the height of the second outer electrode OGE2 of the long channel transistor on the second region RG2 may be controlled to be within a desirable range. By enhancing the uniformity in the profile of the top surface TOS2 of the second outer electrode OGE2, it may be possible to reduce process failures and improve the reliability of the semiconductor device.

FIGS. 7A to 12D are sectional views illustrating a method of fabricating a semiconductor device, according to an embodiment of the inventive concept. In detail, FIGS. 7A, 8A, 9A, 10A, 11A, and 12A are sectional views corresponding to the line A-A' of FIG. 4. FIGS. 9B, 10B, 11B, and 12B are sectional views corresponding to the line B-B' of FIG. 4. FIGS. 9C and 10C are sectional views corresponding to the line C-C' of FIG. 4. FIGS. 7B, 8B, 11C, and 12C are sectional views corresponding to the line D-D' of FIG. 4. FIGS. 7C, 8C, 9D, 10D, 11D, and 12D are sectional views corresponding to the line E-E' of FIG. 4.

Figure 7A:
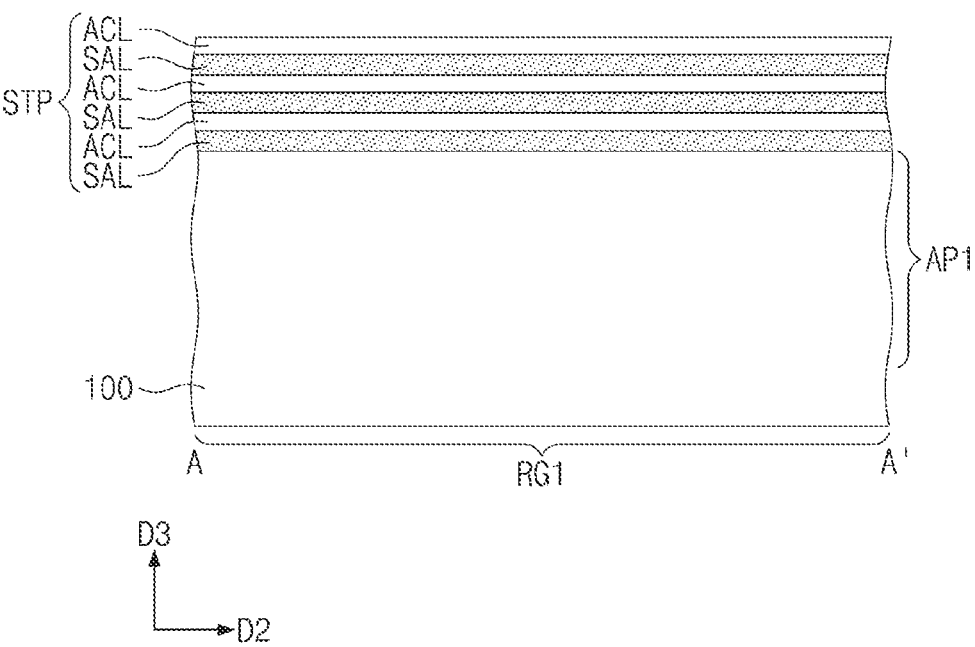
FIGS. 7A to 12D are sectional views illustrating a method of fabricating a semiconductor device, according to an embodiment of the inventive concept.
Figure 7B:
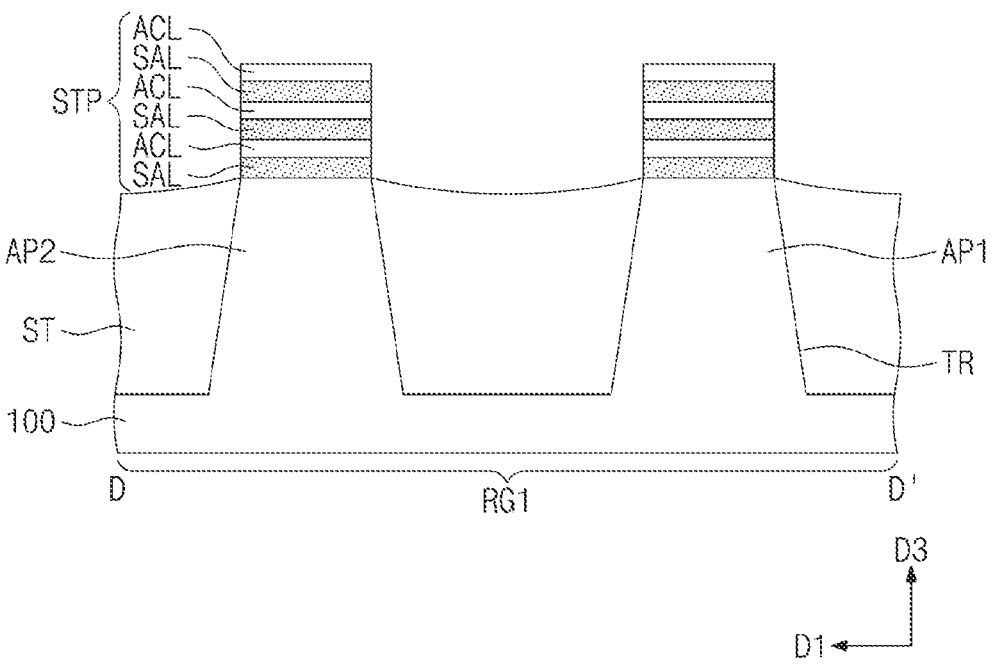
Figure 7C:
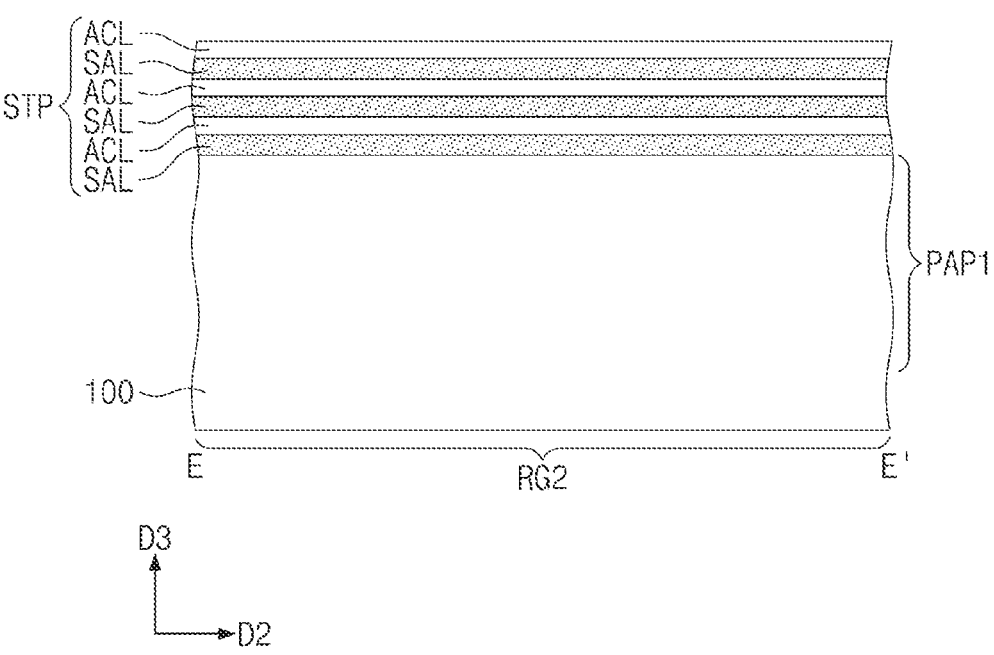

Referring to FIGS. 7A to 7C, the substrate 100 including the first and second regions RG1 and RG2 may be provided. Active layers ACL and sacrificial layers SAL may be alternately stacked on the top surface of the substrate 100. The active and sacrificial layers ACL and SAL may be formed of or include at least one of silicon (Si), germanium (Ge), or silicon germanium (SiGe), where the active and sacrificial layers ACL and SAL may be formed of different materials from each other that provide etch selectivity.

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration of each of the sacrificial layers SAL may be in a range from about 10 at % to about 30 at %.

First mask patterns may be formed on the substrate 100 to define the first and second active regions AP1 and AP2. Second mask patterns may be formed on the substrate 100 to define the first and second peripheral active regions PAP1 and PAP2. Each of the first and second mask patterns may be a line- or bar-shaped pattern extending in the second direction D2.

A first patterning process, in which the first mask patterns are used as an etch mask, may be performed to form the first and second active regions AP1 and AP2 on the first region RG1 (e.g., FIG. 7B). The trench TR may be formed between the first and second active regions AP1 and AP2, where the trench TR may be formed by removing a portion of the substrate 100. A second patterning process, in which the second mask patterns are used as an etch mask, may be performed to form the first and second peripheral active regions PAP1 and PAP2 on the second region RG2 (e.g., FIG. 7C).

A stacking pattern STP may be formed on each of the first and second active regions AP1 and AP2. The stacking pattern STP may be formed on each of the first and second peripheral active regions PAP1 and PAP2. The stacking pattern STP may include the active layers ACL and the sacrificial layers SAL which are alternately stacked. During the first patterning process, the stacking pattern STP may be formed together with the first and second active regions AP1 and AP2. During the second patterning process, the stacking pattern STP may be formed together with the first and second active regions AP1 and AP2.

The device isolation layer ST may be formed to fill the trench TR. In detail, an insulating layer may be formed on the substrate 100 to cover the first and second active regions AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed at a level higher than the device isolation layer ST and may be exposed to the outside of the device isolation layer ST (e.g., FIG. 7B). In other words, the stacking patterns STP may protrude vertically above the device isolation layer ST.

Figure 8A:
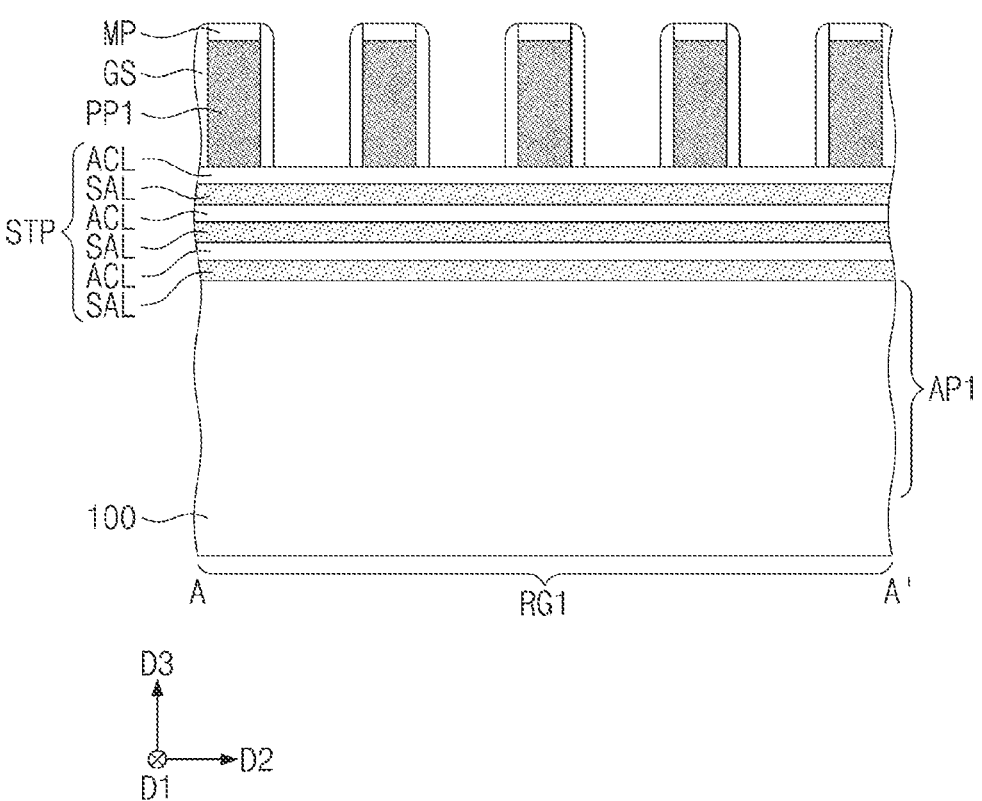
Figure 8B:
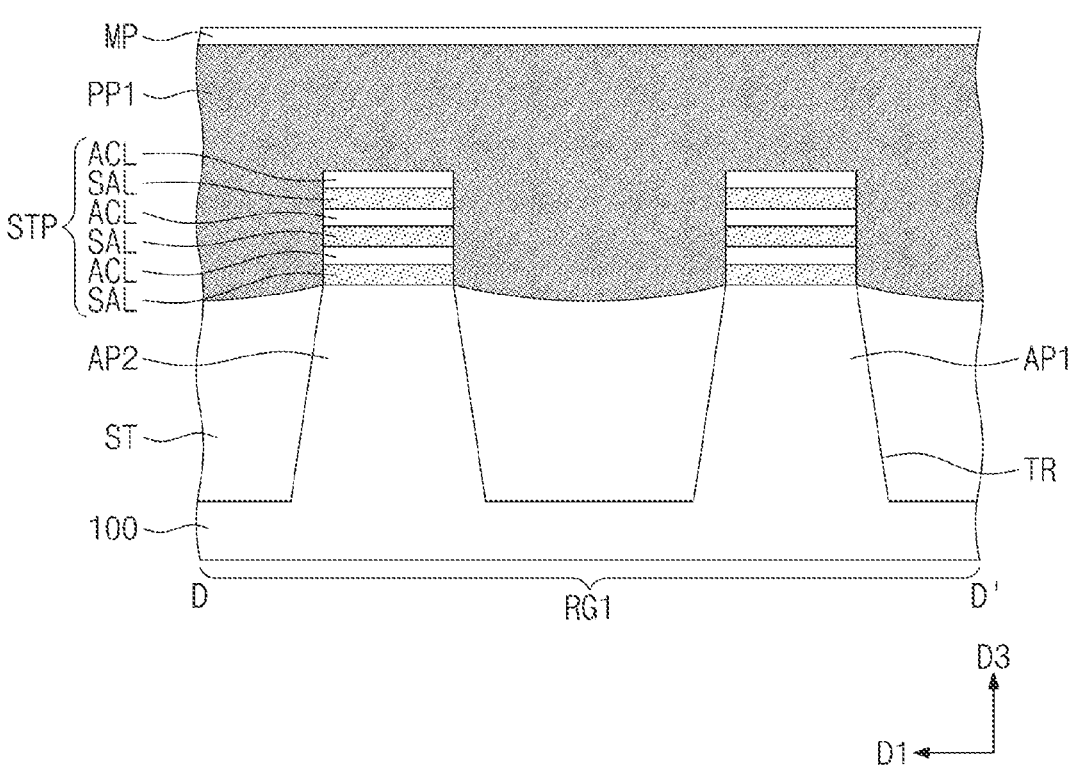
Figure 8C:
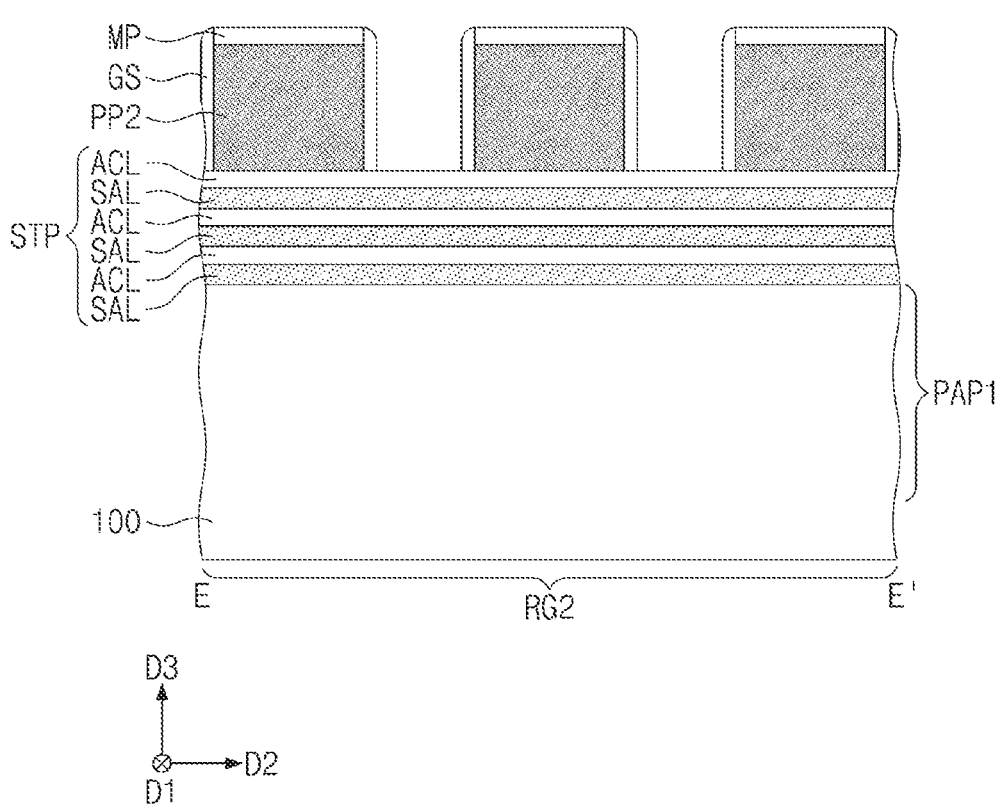

Referring to FIGS. 8A to 8C, first sacrificial patterns PP1 may be formed on the first region RG1 to cross the stacking patterns STP. Each of the first sacrificial patterns PP1 may be a linear or bar-shaped pattern extended in the first direction D1. The first sacrificial patterns PP1 may be arranged at a first pitch in the second direction D2.

In various embodiments, the formation of the first sacrificial patterns PP1 may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the first sacrificial patterns PP1. The formation of the gate spacers GS may include conformally forming a gate spacer layer on the substrate 100 and anisotropically etching the gate spacer layer. In an embodiment, the gate spacer GS may be a multi-layered structure including at least two layers.

Second sacrificial patterns PP2 may be formed on the second region RG2 to cross the stacking patterns STP (e.g., FIG. 8C). Each of the second sacrificial patterns PP2 may be a linear or bar-shaped pattern that is formed to extend in the first direction D1. A linewidth of the second sacrificial pattern PP2 may be larger than a linewidth of the first sacrificial pattern PP1. The second sacrificial patterns PP2 may be arranged at a third pitch, which is larger than the first pitch, in the second direction D2.

Referring to FIGS. 9A to 9D, the first recesses RS1 may be formed in the stacking pattern STP on the first active region AP1. The second recesses RS2 may be formed in the stacking pattern STP on the second active region AP2. During the formation of the first and second recesses RS1 and RS2, the device isolation layer ST may also be recessed at both sides of each of the first and second active regions AP1 and AP2 (e.g., see FIG. 9C).

In various embodiments, the first recesses RS1 may be formed by etching the stacking pattern STP on the first active region AP1, using the hard mask patterns MP and the gate spacers GS as an etch mask. The first recess RS1 may be formed between each adjacent pair of the first sacrificial patterns PP1.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3 between adjacent ones of the first recesses RS1 may constitute the first channel pattern CH1 (e.g., FIG. 9A).

The sacrificial layers SAL may be exposed by the first recess RS1. A selective etching process may be performed on the exposed sacrificial layers SAL. The etching process may include a wet etching process of removing the silicon-germanium selectively. As a result of the etching process, each of the sacrificial layers SAL may be indented to form an indent region IDR, where the indent region IDR can be recessed beneath an overlying semiconductor pattern. Due to the presence of the indent region IDR, the sacrificial layer SAL may have a concave side surface. The first recess RS1 may have a wavy inner surface, owing to the indent regions IDR.

Figure 9A:
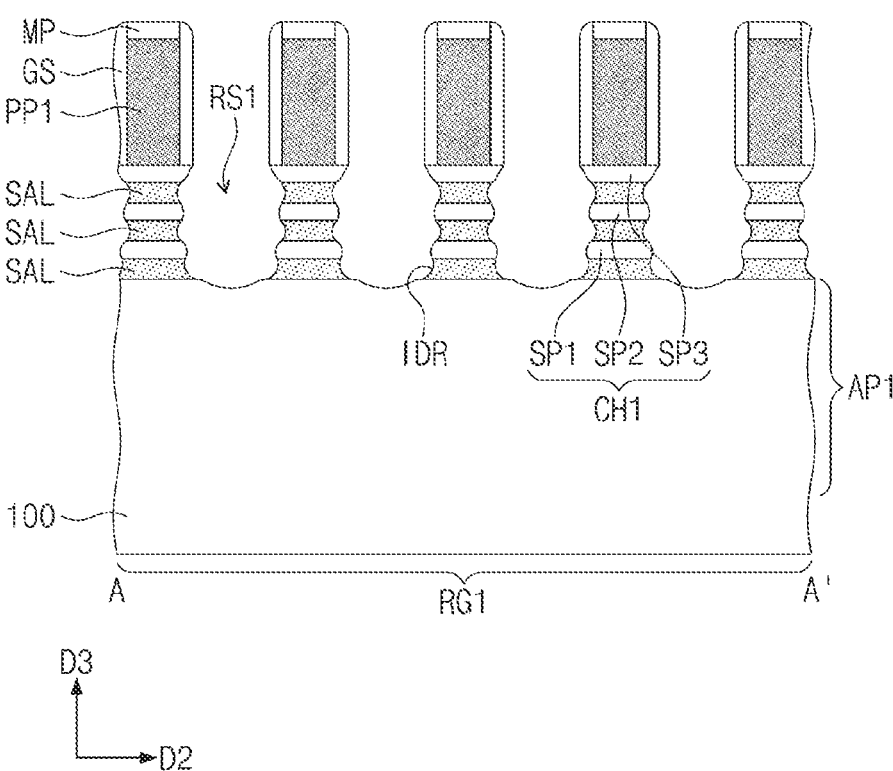
Figure 9B:
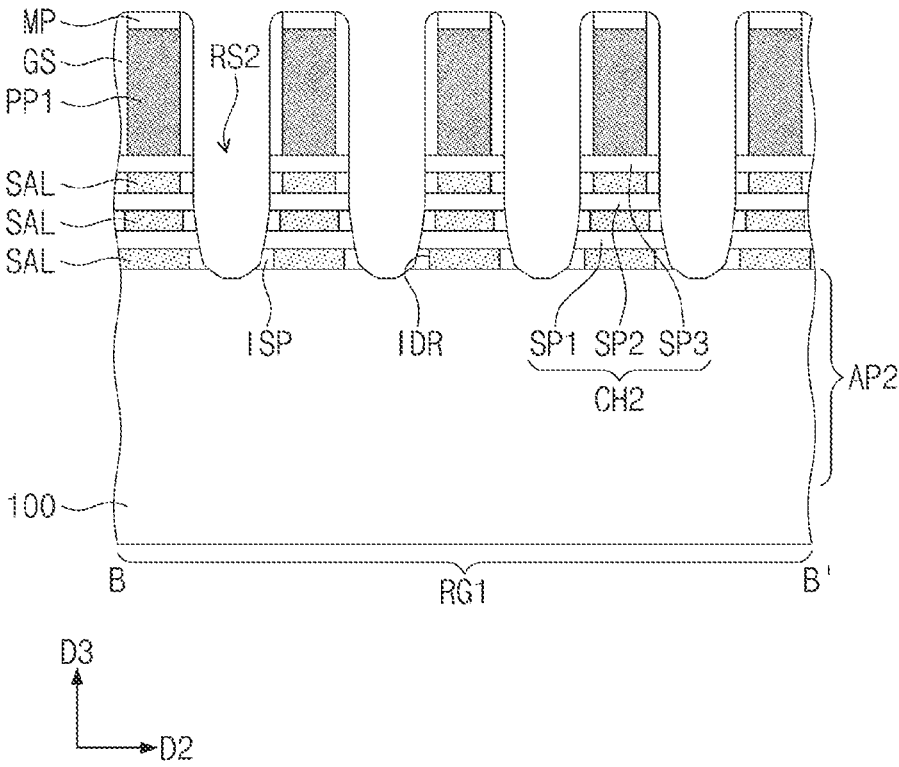
Figure 9C:
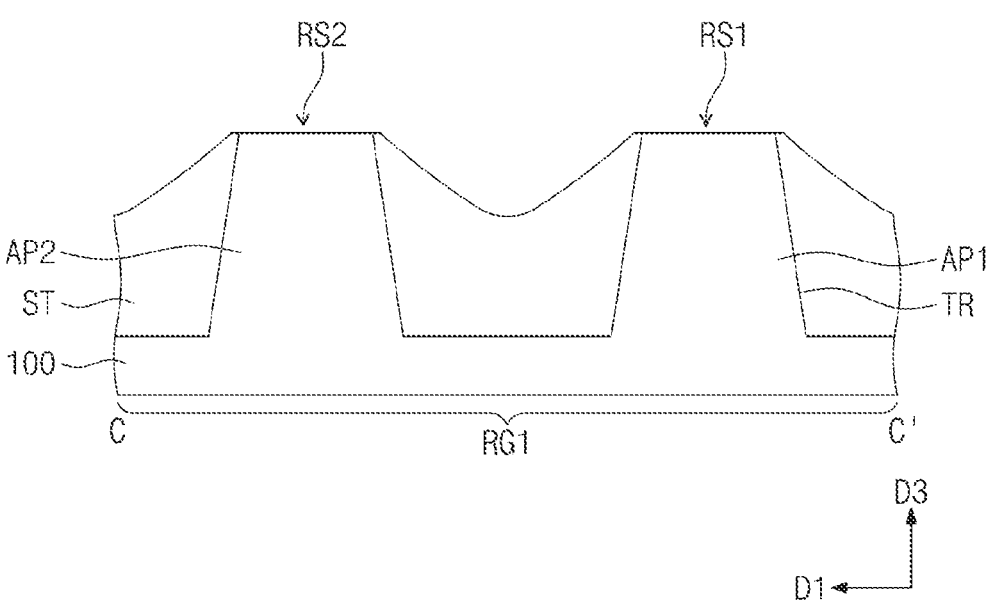
Figure 9D:
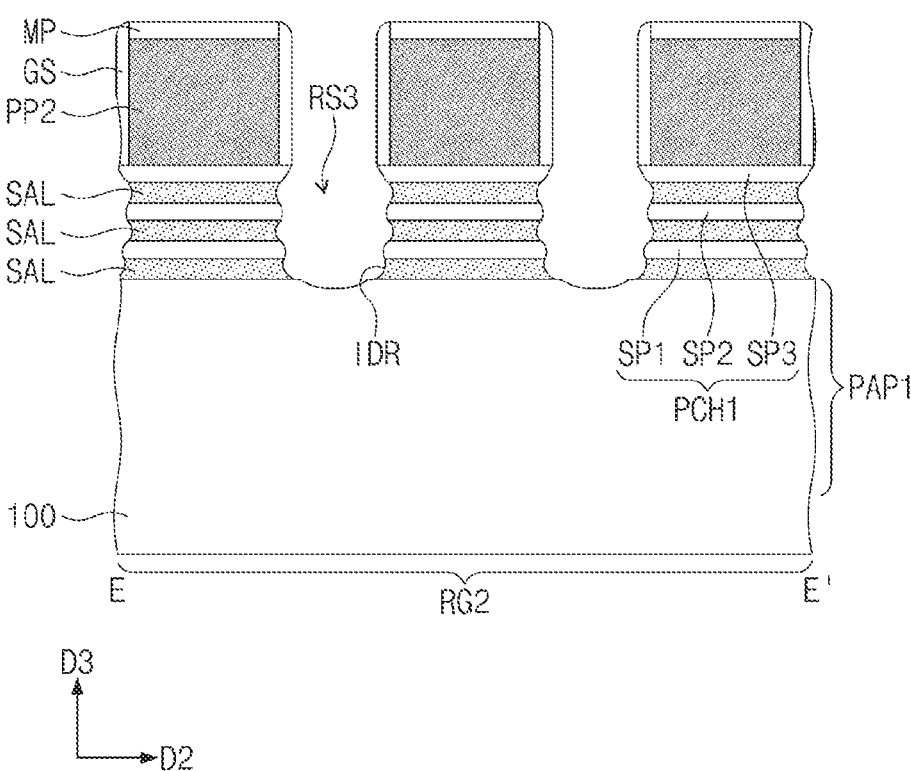

Third recesses RS3 may be formed by etching the stacking pattern STP on the first peripheral active region PAP1 (e.g., see FIG. 9D). In an embodiment, the third recesses RS3 may be formed concurrently with the first recesses RS1 described above. The first to third semiconductor patterns SP1, SP2, and SP3 constituting the first peripheral channel pattern PCH1 may be formed between the third recesses RS3, which are adjacent to each other.

The second recesses RS2 in the stacking pattern STP on the second active region AP2 may be formed by a method similar to that for the first recesses RS1. A selective etching process may be performed on the sacrificial layers SAL exposed by the second recess RS2, and thus, the indent regions IDR may also be formed on the second active region AP2. The inner spacers ISP may be formed in the indent regions IDR on the second active region AP2 (e.g., see FIG. 9B). The first to third semiconductor patterns SP1, SP2, and SP3 between adjacent ones of the second recesses RS2 may constitute the second channel pattern CH2.

Referring to FIGS. 10A to 10D, the first source/drain patterns SD1 may be formed in the first recesses RS1, respectively. In detail, a SEG process, in which an inner surface of the first recess RS1 is used as a seed layer, may be performed to form an epitaxial layer filling the first recess RS1. The epitaxial layer may be grown using the first to third semiconductor patterns SP1, SP2, and SP3, the sacrificial layers SAL, and the substrate 100, which are exposed by the first recess RS1, as a seed layer. In an embodiment, the SEG process may include a chemical vapor deposition (CVD) process or a molecular beam epitaxy (MBE) process.

In an embodiment, the first source/drain pattern SD1 may be formed of or include a semiconductor material (e.g., SiGe) whose lattice constant is greater than that of a semiconductor material of the substrate 100. During the formation of the first source/drain pattern SD1, the first source/drain pattern SD1 may be doped in-situ with p-type impurities (e.g., boron, gallium, or indium). Alternatively, the first source/drain pattern SD1 may be doped with impurities after the formation of the first source/drain pattern SD1.

Figure 10A:
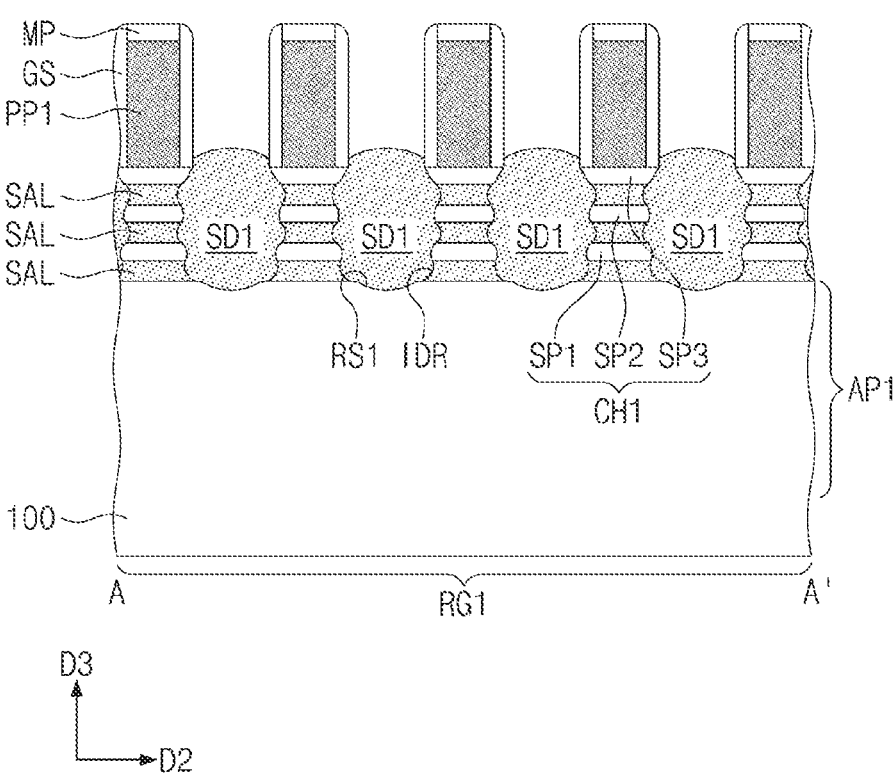
Figure 10B:
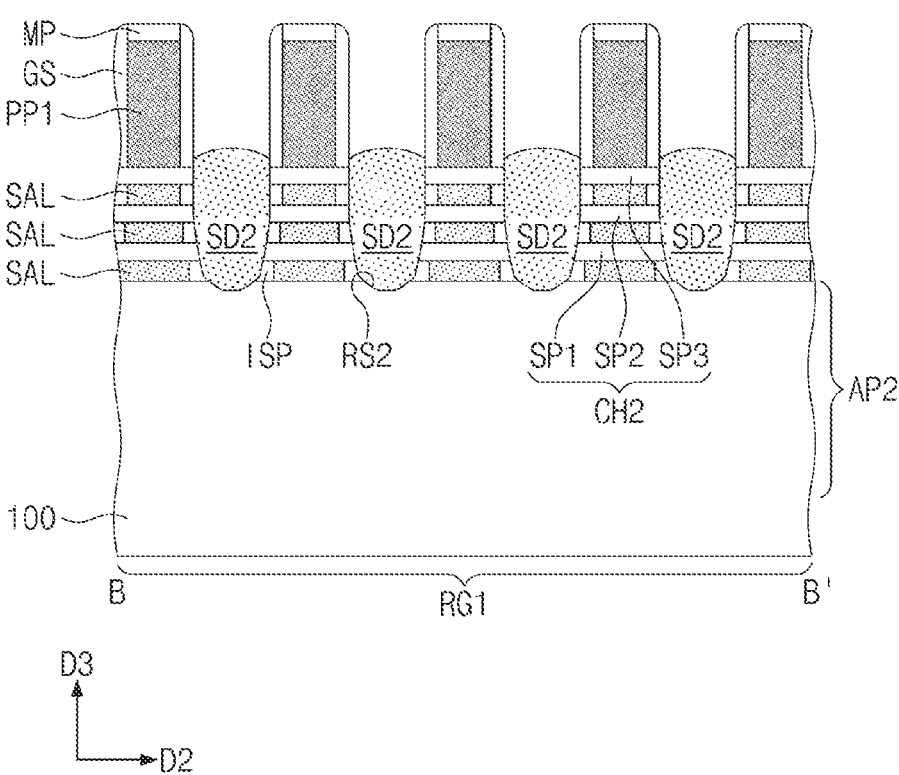
Figure 10C:
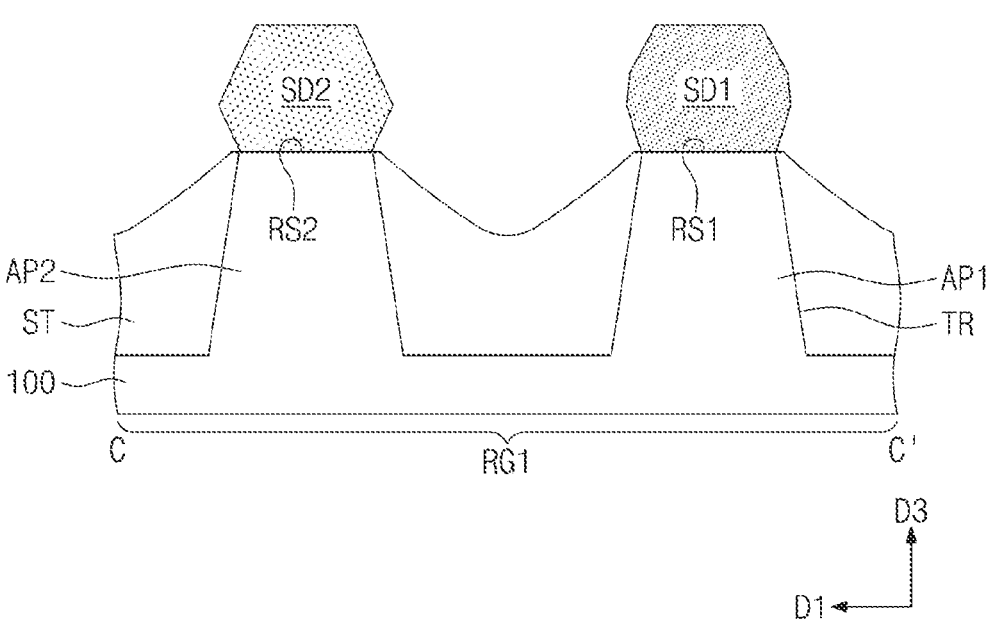
Figure 10D:
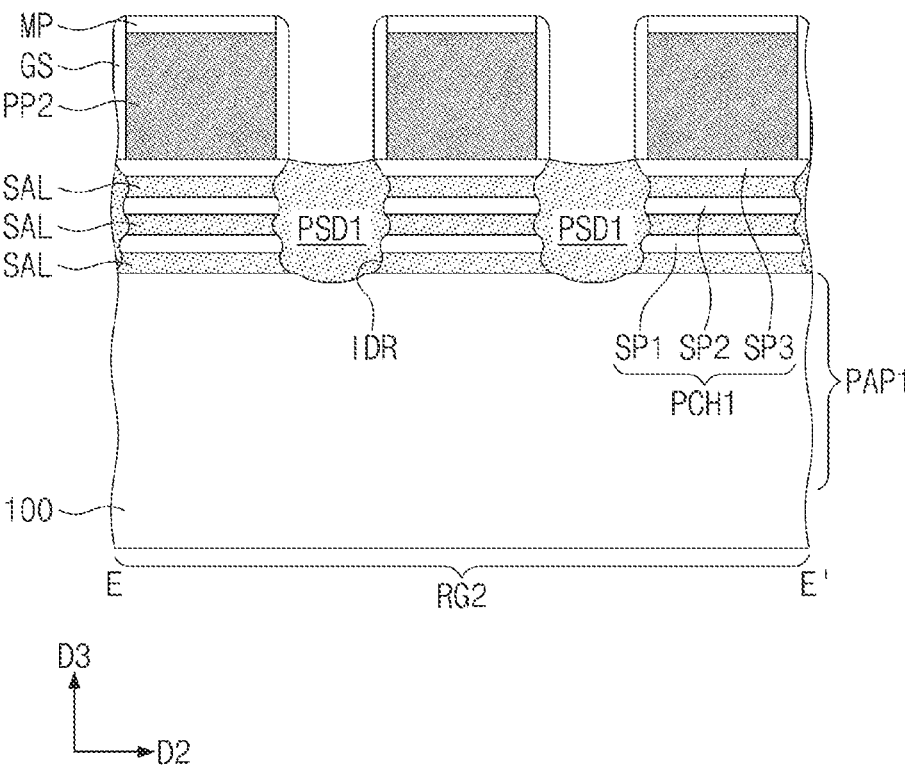

The first peripheral source/drain patterns PSD1 may be formed in the third recesses RS3, respectively (e.g., see FIG. 10D). In an embodiment, the first peripheral source/drain patterns PSD1 and the first source/drain patterns SD1 may be formed at the same time. A width of the third recess RS3 in the second direction D2 may be larger than a width of the first recess RS1 in the second direction D2, and in this case, the third recess RS3 may not be fully filled with the first peripheral source/drain pattern PSD1. For example, a top surface of the first peripheral source/drain pattern PSD1 may be concavely recessed.

The second source/drain patterns SD2 may be formed in the second recesses RS2, respectively (e.g., see FIG. 10B). In detail, the second source/drain pattern SD2 may be formed by a SEG process using an inner surface of the second recess RS2 as a seed layer.

In an embodiment, the second source/drain pattern SD2 may be formed of or include the same semiconductor element (e.g., Si) as the substrate 100. During the formation of the second source/drain pattern SD2, the second source/drain pattern SD2 may be doped in-situ with n-type impurities (e.g., phosphorus, arsenic, or antimony). Alternatively, impurities may be injected into the second source/drain pattern SD2 after the formation of the second source/drain pattern SD2.

Figure 11A:
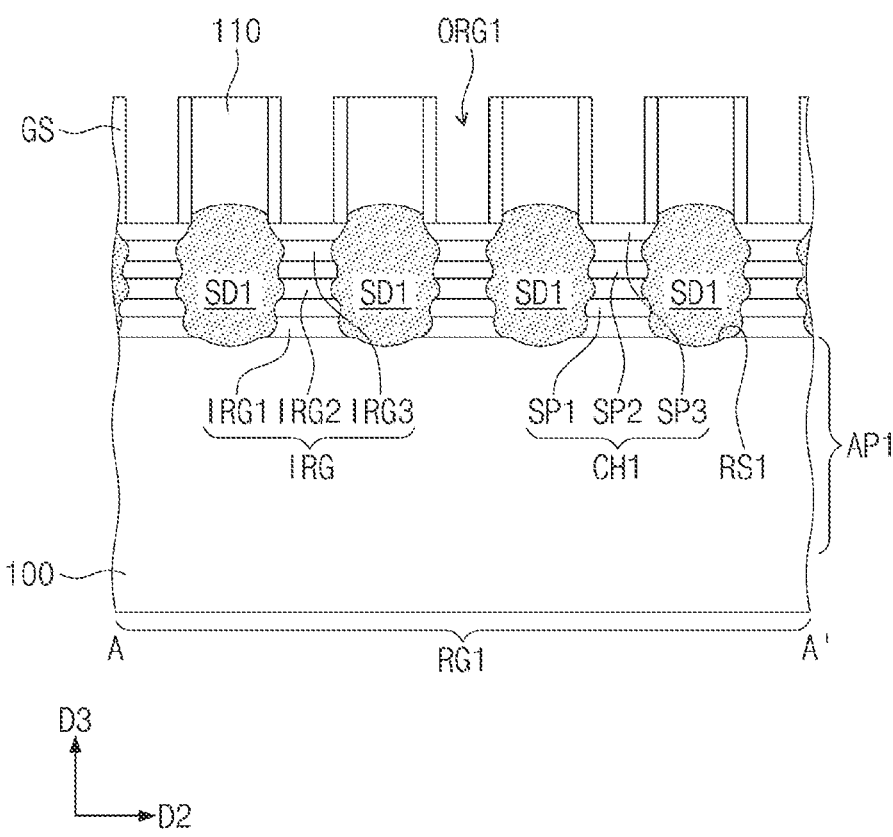
Figure 11B:
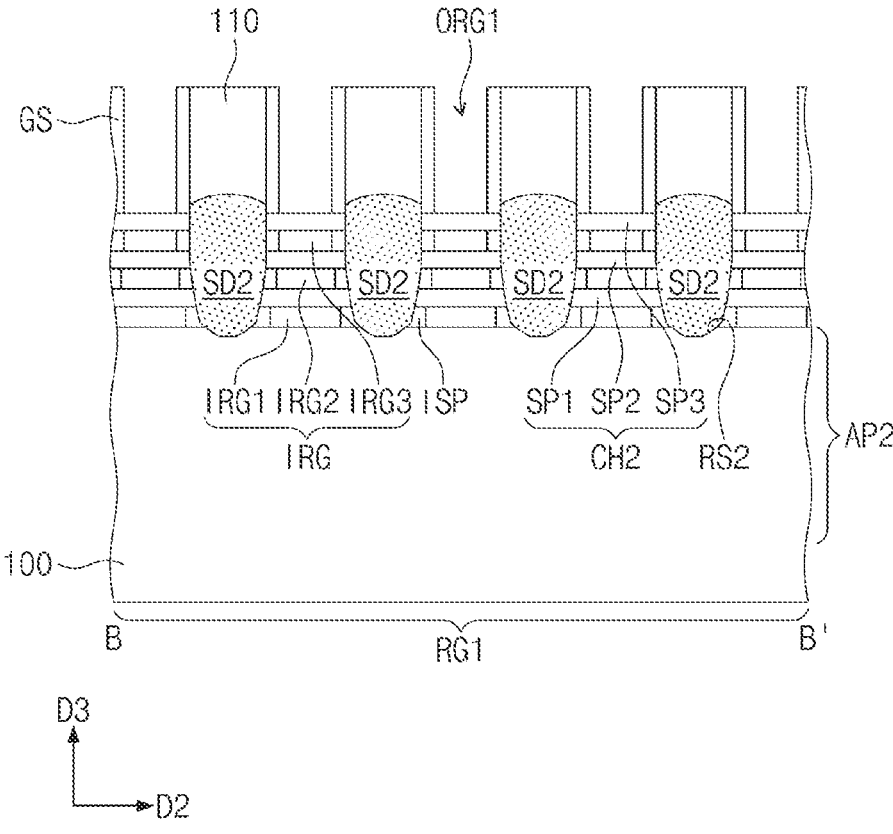
Figure 11C:
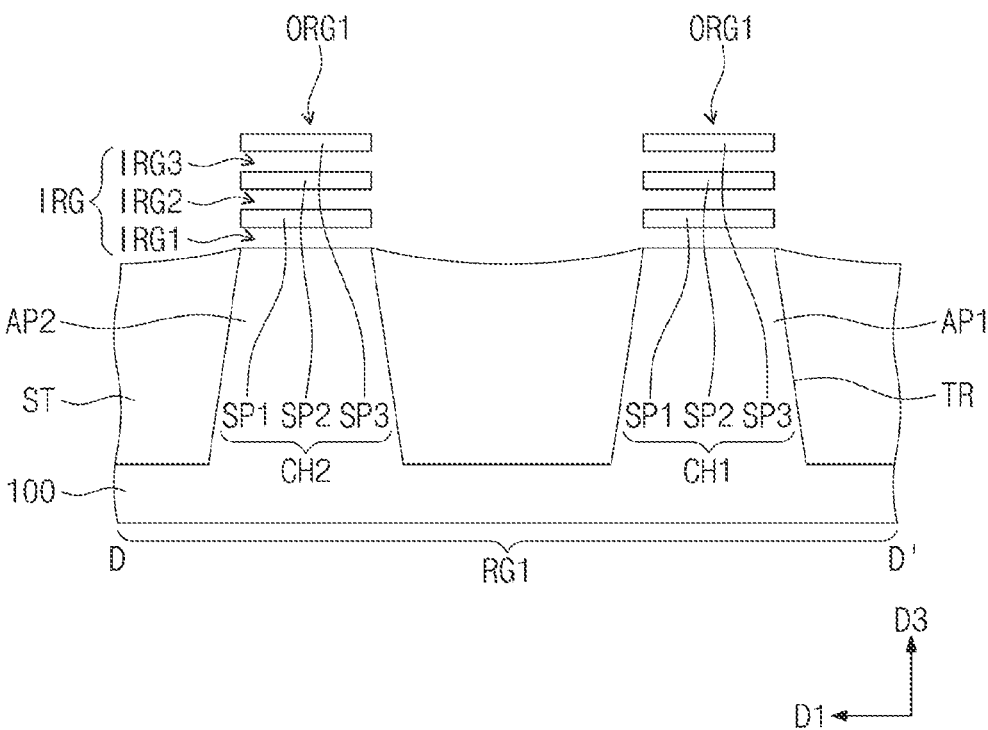
Figure 11D:
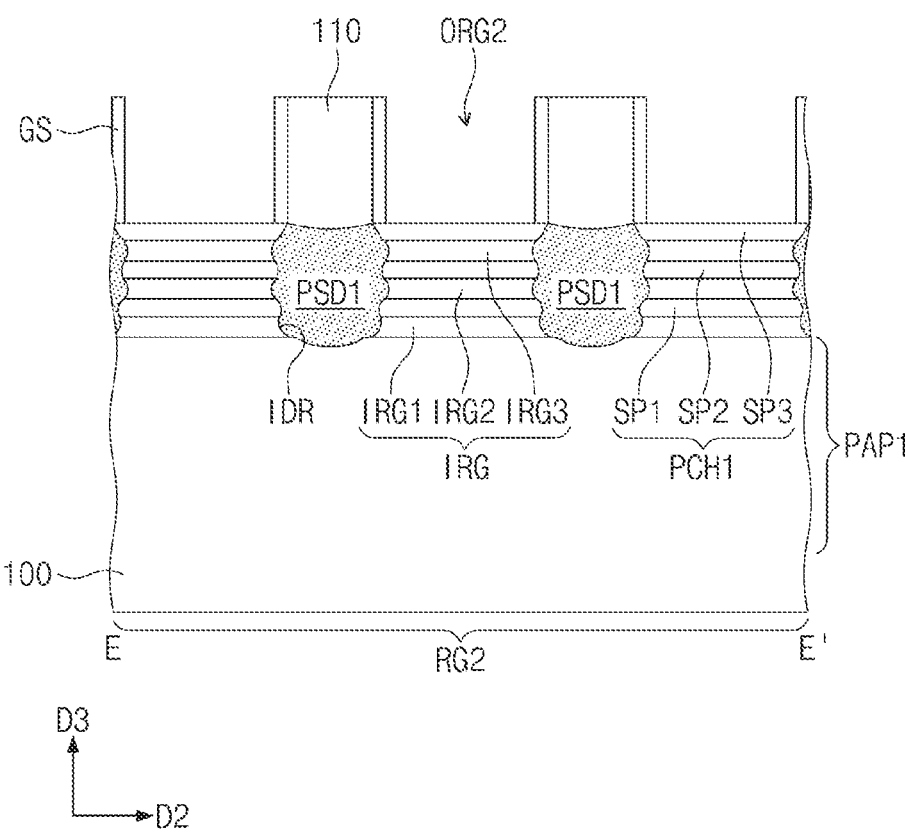

Referring to FIGS. 11A to 11C, the first interlayer insulating layer 110 may be formed to cover the first and second source/drain patterns SD1 and SD2, the hard mask patterns MP, and the gate spacers GS. In an embodiment, the first interlayer insulating layer 110 may include a silicon oxide layer.

The first interlayer insulating layer 110 may be planarized to expose the top surfaces of the first sacrificial patterns PP1. The planarization of the first interlayer insulating layer 110 may be performed using an etch-back or chemical-mechanical polishing (CMP) process. The hard mask patterns MP may be fully removed during the planarization process. Accordingly, the top surface of the first interlayer insulating layer 110 may be coplanar with the top surfaces of the first sacrificial patterns PP1 and the top surfaces of the gate spacers GS.

The exposed first sacrificial patterns PP1 may be selectively removed. As a result of the removal of the first sacrificial pattern PP1, a first outer region ORG1 exposing the channel pattern CH1 or CH2 may be formed (e.g., see FIG. 11C). The removal of the first sacrificial patterns PP1 may include a wet etching process which is performed using an etching solution capable of selectively etching polysilicon.

Inner regions IRG may be formed by selectively removing the sacrificial layers SAL exposed through the first outer region ORG1 (e.g., see FIG. 11C). In detail, a process of selectively etching the sacrificial layers SAL may be performed to leave the first to third semiconductor patterns SP1, SP2, and SP3 and to remove only the sacrificial layers SAL. The etching process may be chosen to exhibit a high etch rate for a material (e.g., SiGe) having a relatively high germanium concentration. For example, the etching process may be chosen to exhibit a high etch rate for a silicon-germanium layer whose germanium concentration is higher than about 10 at %.

The sacrificial layers SAL on the first and second active regions AP1 and AP2 may be removed during the etching process. The etching process may be a wet etching process. An etchant material, which is used in the etching process, may be chosen to quickly remove the sacrificial layer SAL having a relatively high germanium concentration.

Referring back to FIG. 11C, as a result of the selective removal of the sacrificial layers SAL, only the stacked first to third semiconductor patterns SP1, SP2, and SP3 may be left on each of the first and second active regions AP1 and AP2. Hereinafter, empty regions, which are formed by removing the sacrificial layers SAL, will be referred to as first to third inner regions IRG1, IRG2, and IRG3, respectively (e.g., see FIG. 11A). In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

The exposed second sacrificial patterns PP2 may be selectively removed. Accordingly, a second outer region ORG2 exposing the peripheral channel pattern PCH1 or PCH2 may be formed (e.g., see FIG. 11D). The second outer region ORG2 may be formed together with the first outer region ORG1. First to third inner regions IRG1 to IRG3 may be formed by selectively removing the sacrificial layers SAL exposed through the second outer region ORG2 (e.g., see FIG. 11D).

Referring to FIGS. 12A to 12D, the gate insulating layer GI may be formed on the exposed first to third semiconductor patterns SP1, SP2, and SP3. The gate insulating layer GI may be formed to enclose each of the first to third semiconductor patterns SP1, SP2, and SP3. The gate insulating layer GI may be formed in each of the first to third inner regions IRG1, IRG2, and IRG3. The gate insulating layer GI may cover the sidewalls of the gate spacers GS of the first outer region ORG1.

The gate electrode GE may be formed on the gate insulating layer GI in the first region RG1. The formation of the gate electrode GE may include forming the first to third inner electrodes IGE1, IGE2, and IGE3 in the first to third inner regions IRG1, IRG2, and IRG3, respectively, and forming the first outer electrode OGE1 in the first outer region ORG1 (e.g., see FIG. 12A). The gate electrode GE may be vertically recessed to have a reduced height. The gate capping pattern GP may be formed on the recessed gate electrode GE.

The peripheral gate electrode PGE may be formed on the gate insulating layer GI in the second region RG2. The formation of the peripheral gate electrode PGE may include forming the first to third inner electrodes IGE1, IGE2, and IGE3 in the first to third inner regions IRG1, IRG2, and IRG3, respectively, and forming the second outer electrode OGE2 in the second outer region ORG2 (e.g., see FIG. 12D). The gate capping pattern GP may also be formed on the peripheral gate electrode PGE.

Referring back to FIGS. 5A to 5E, the division structures DB may be respectively formed on borders of the single height cell SHC. The division structure DB may be formed to penetrate the gate capping pattern GP and the gate electrode GE and extend into the active region AP1 or AP2. The division structure DB may be formed of or include at least one of insulating materials (e.g., silicon oxide or silicon nitride).

The second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The formation of the active and gate contacts AC and GC may include forming the barrier pattern BM and forming the conductive pattern FM on the barrier pattern BM. The barrier pattern BM may be conformally formed and may include a metal layer and/or a metal nitride layer. The conductive pattern FM may be formed of or include a low resistance metal.

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 12A:
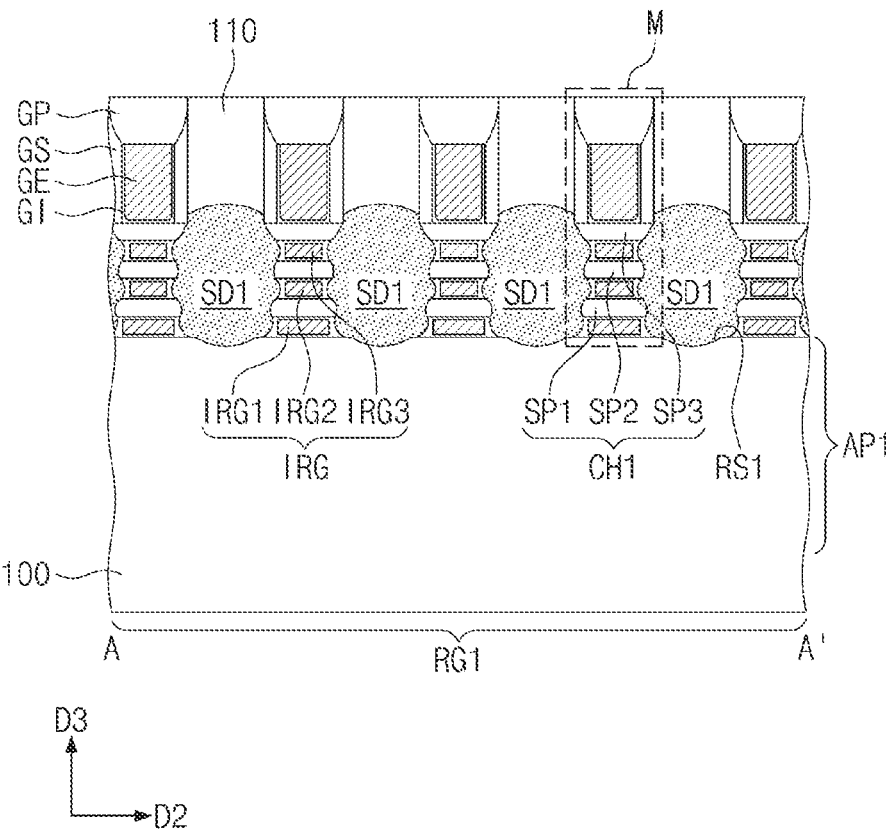
Figure 12B:
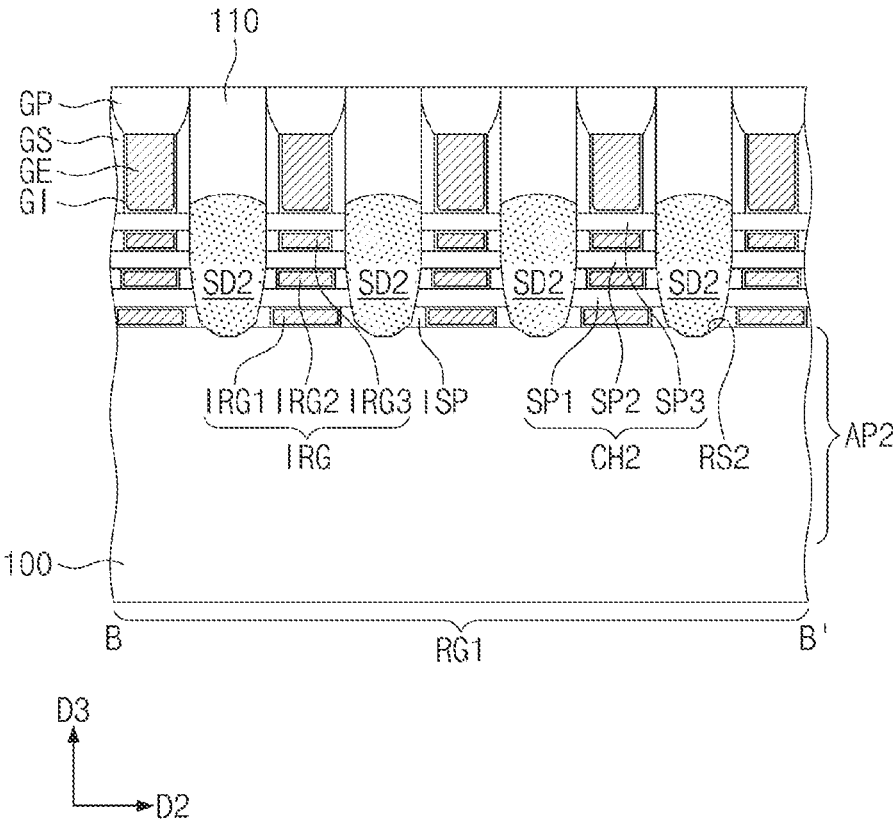
Figure 12C:
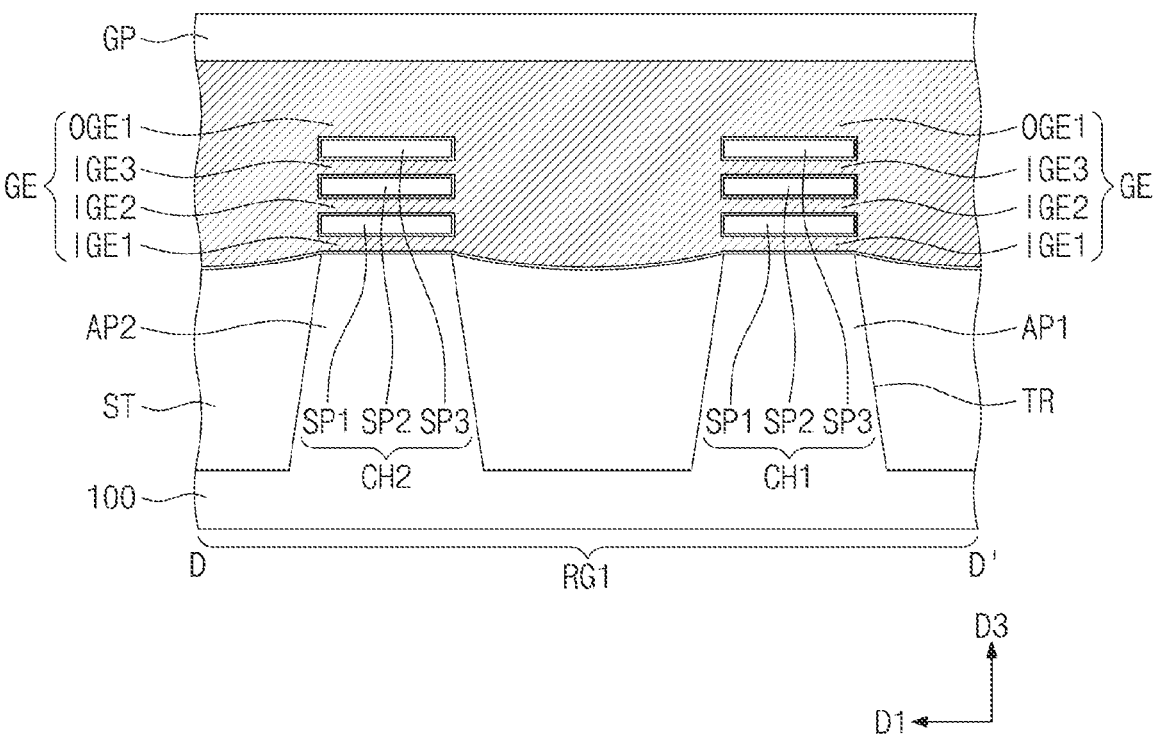
Figure 12D:
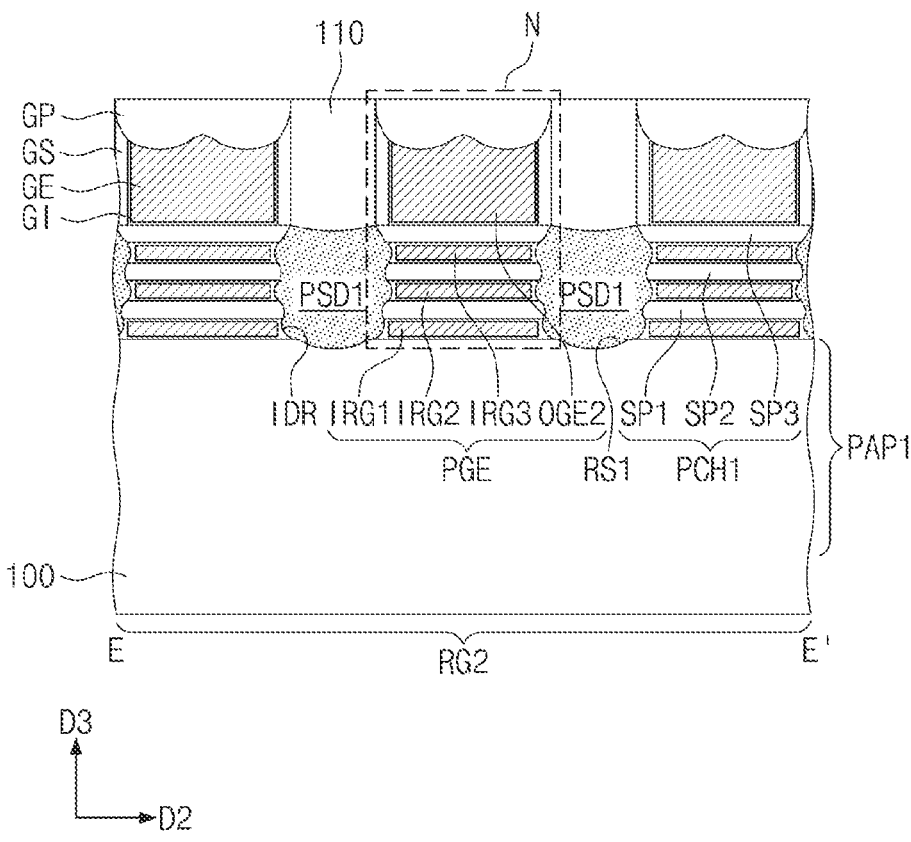
Figure 13A:
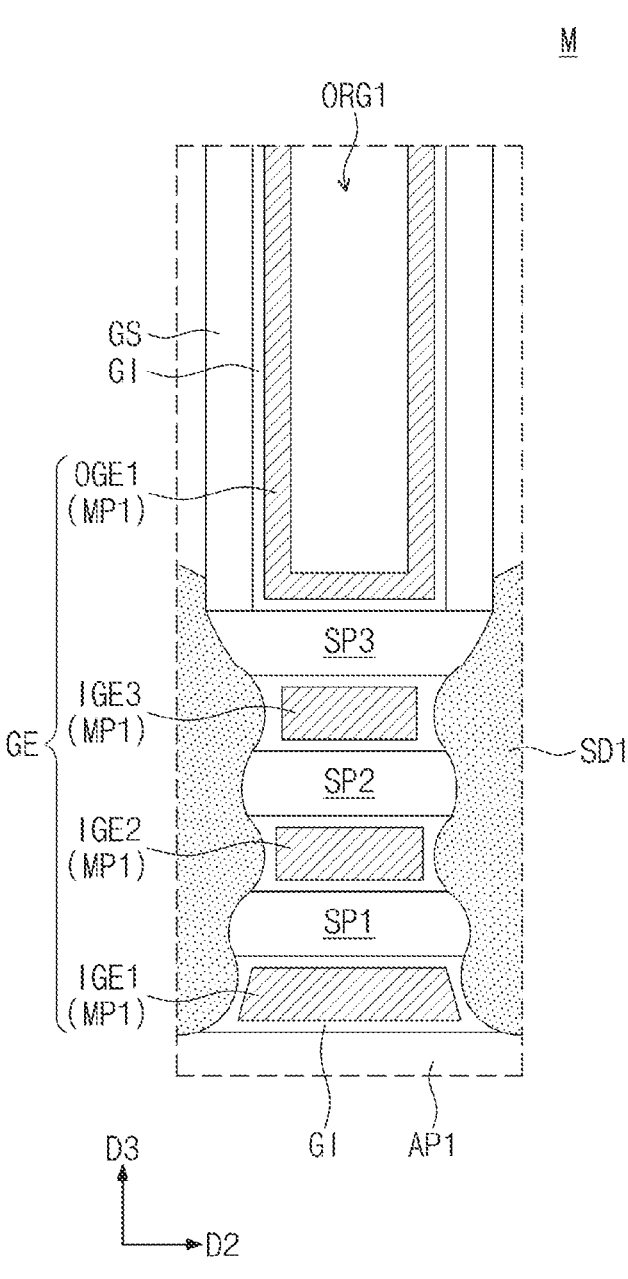
FIGS. 13A, 14A, and 15A are enlarged sectional views, each illustrating a method of forming a portion 'M' of FIG. 12A, according to an embodiment of the inventive concept.
Figure 13B:
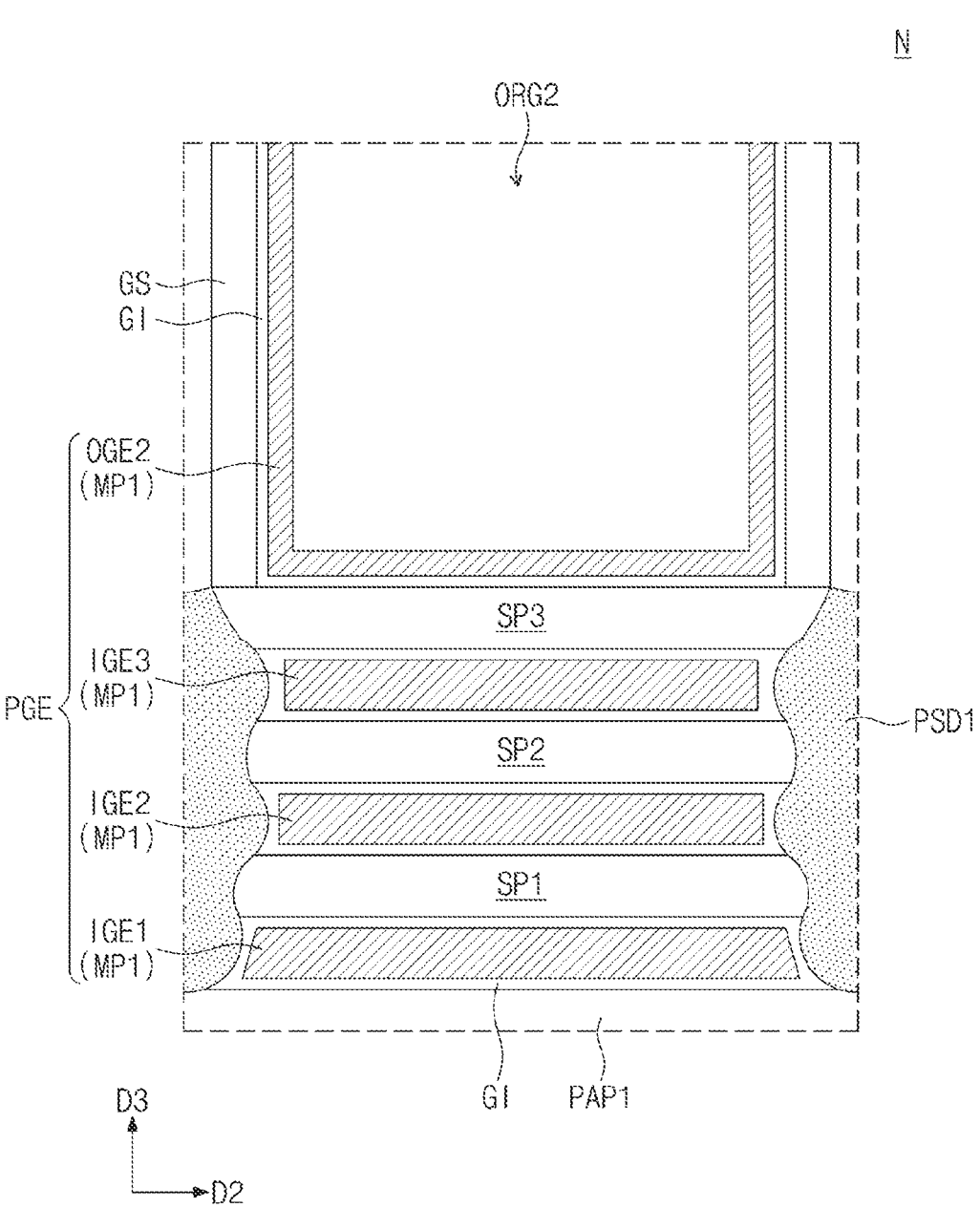
FIGS. 13B, 14B, and 15B are enlarged sectional views, each illustrating a method of forming a portion 'N' of FIG. 12D, according to an embodiment of the inventive concept.
Figure 14A:
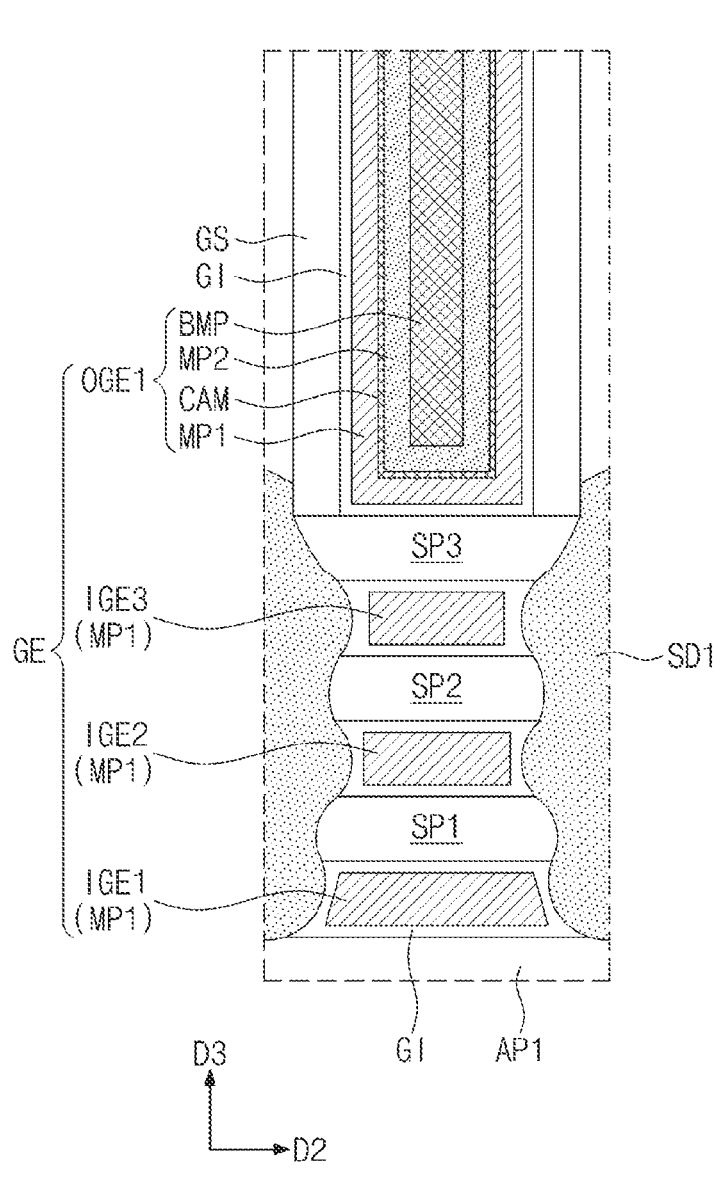
Figure 14B:
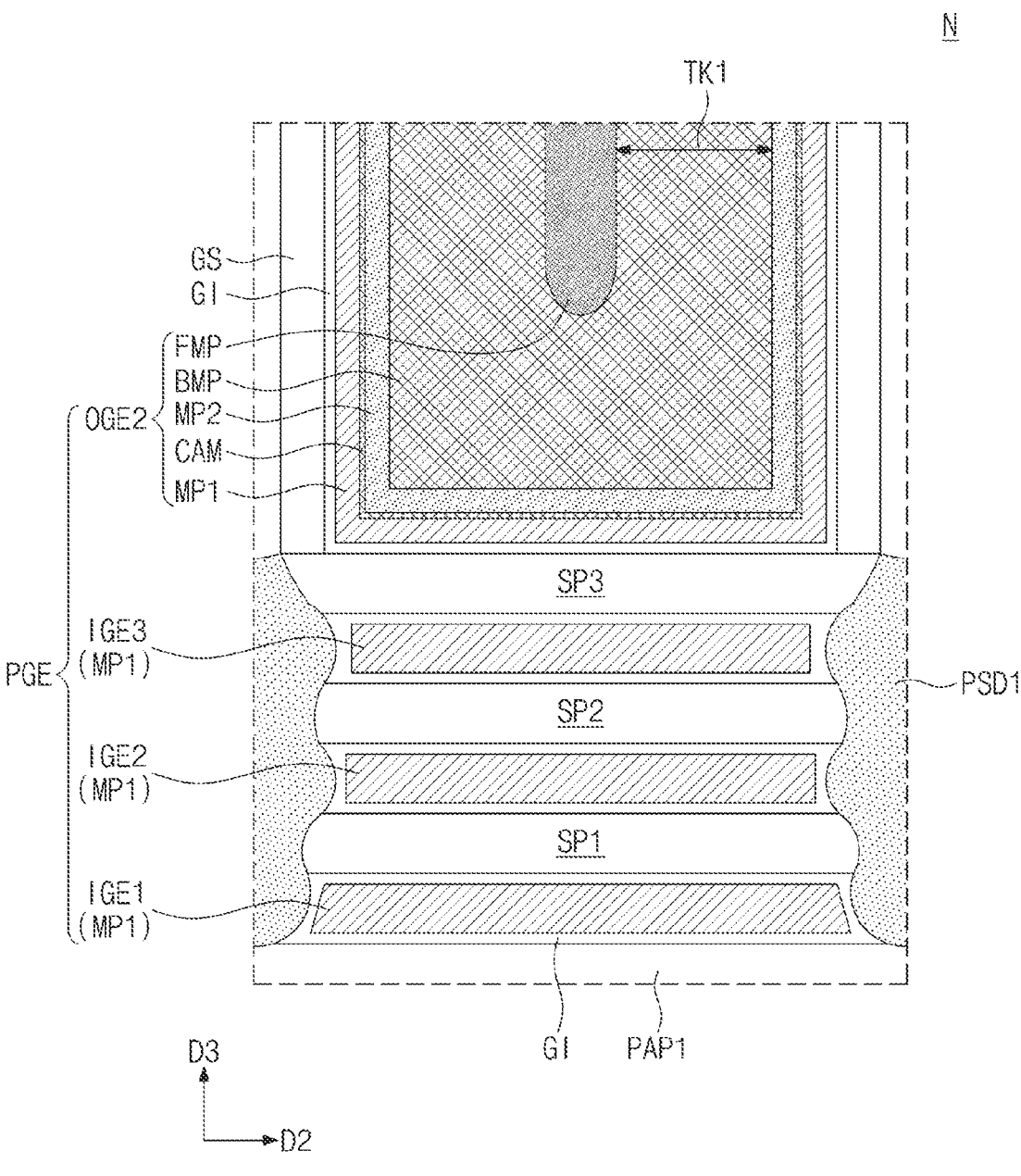
Figure 15A:
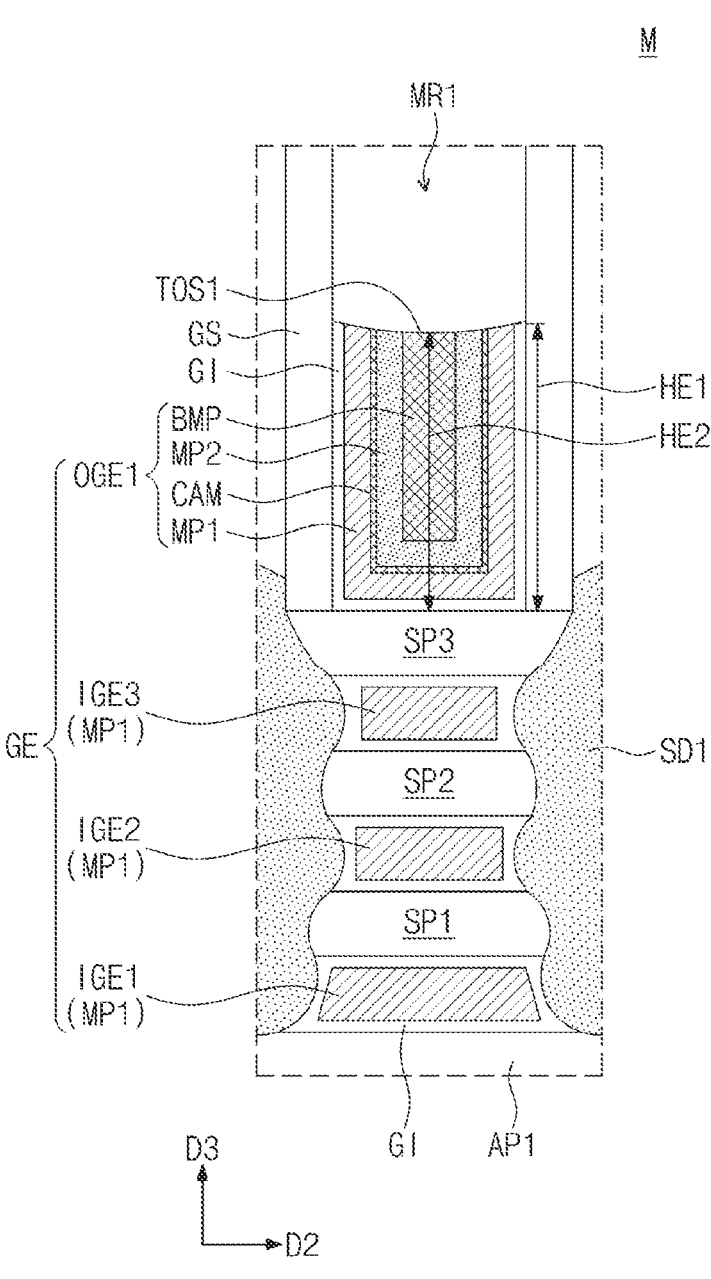
Figure 15B:
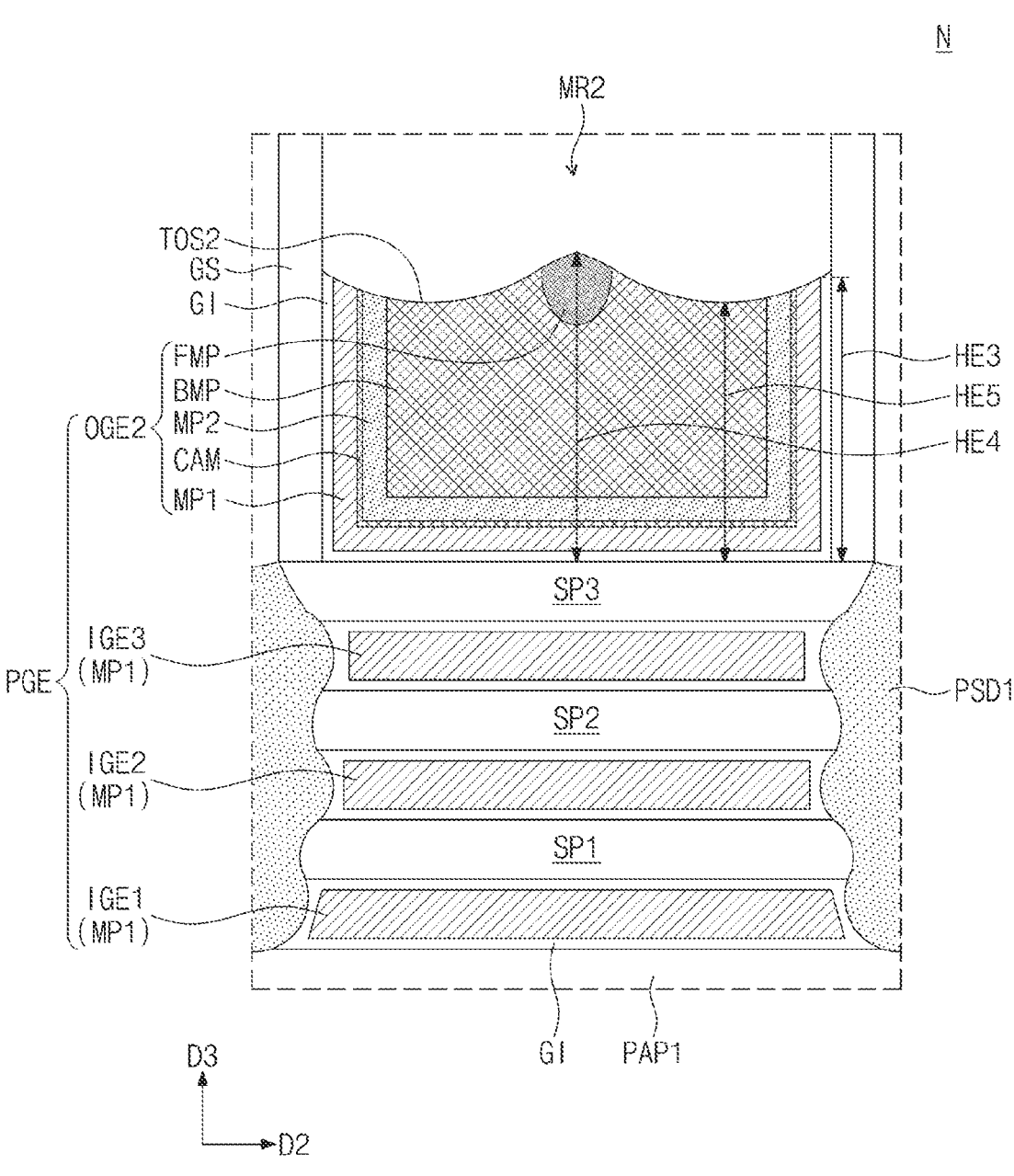

FIGS. 13A, 14A, and 15A are enlarged sectional views, each illustrating a method of forming a portion 'M' of FIG. 12A, according to an embodiment of the inventive concept. FIGS. 13B, 14B, and 15B are enlarged sectional views, each illustrating a method of forming a portion 'N' of FIG. 12D, according to an embodiment of the inventive concept.

Referring to FIGS. 13A and 13B, the gate insulating layer GI and the first metal pattern MP1 may be sequentially formed in the first and second outer regions ORG1 and ORG2 previously described with reference to FIGS. 11A to 11D. As an example, the first metal pattern MP1 may be formed to completely fill the first to third inner regions IRG1, IRG2, and IRG3. The first metal pattern MP1 may partially fill the first and second outer regions ORG1 and ORG2.

Referring to FIGS. 14A and 14B, the capping pattern CAM, the second metal pattern MP2, and the barrier metal pattern BMP may be sequentially formed in the first and second outer regions ORG1 and ORG2. In an embodiment, the barrier metal pattern BMP may be conformally formed with a first thickness TK1.

The barrier metal pattern BMP may be formed to completely fill the first outer region ORG1. By contrast, the barrier metal pattern BMP may be formed to incompletely (i.e., partially) fill the second outer region ORG2. The fill metal pattern FMP may be further formed in a remaining empty space of the second outer region ORG2, which is not filled with the barrier metal pattern BMP.

Referring to FIGS. 15A and 15B, a metal etching process may be performed on both of the first and second regions RG1 and RG2. For example, the metal etching process may be a dry etching process. In an embodiment, the metal etching process may include a first dry etching process, which exhibits a high etch selectivity with respect to a metal nitride layer (e.g., TiN), and a second dry etching process, which exhibits a high etch selectivity with respect to a low resistance metallic material (e.g., W). In an embodiment, the first and second dry etching processes may be sequentially performed.

As a result of the metal etching process, the top surface TOS1 of the first outer electrode OGE1 may be recessed to form a first metal recess MR1. As a result of the metal etching process, the top surface TOS2 of the second outer electrode OGE2 may be recessed to form a second metal recess MR2.

Owing to the first metal recess MR1, the edge portion of the top surface TOS1 of the first outer electrode OGE1 may have the first height HE1. Owing to the second metal recess MR2, the edge portion of the top surface TOS2 of the second outer electrode OGE2 may have the third height HE3. For example, the third height HE3 may be smaller than about 40 nm. A difference between the third height HE3 and the first height HE1 may be smaller than about 10 nm.

Referring back to FIGS. 6A and 6B, upper portions of the gate spacers GS on the first and second regions RG1 and RG2 may be selectively etched. A capping layer may be formed to fill the first and second metal recesses MR1 and MR2. A planarization process may be performed on the capping layer to form the gate capping patterns GP in the first and second metal recesses MR1 and MR2, respectively. The gate capping pattern GP may be formed to cover the etched top surface of the gate spacer GS.

Figure 16A:
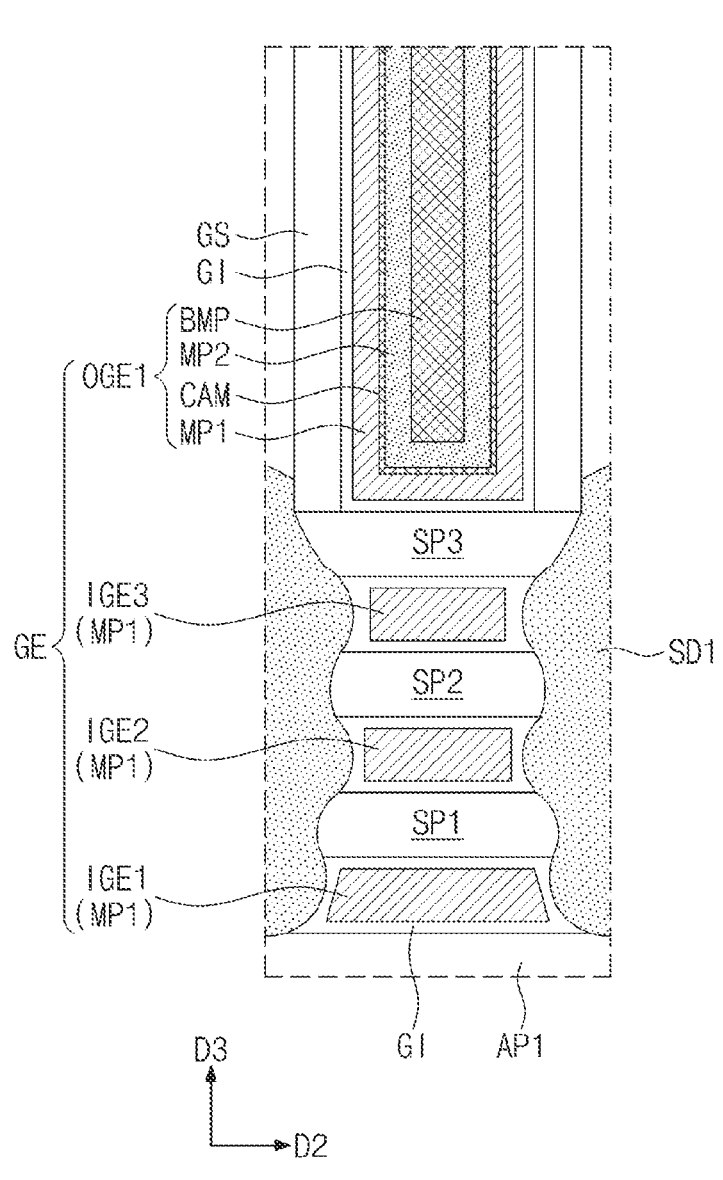
FIGS. 16A, 17A, and 18A are enlarged sectional views, each illustrating a method of forming the portion 'M' of FIG. 12A, according to a comparative example.
Figure 16B:
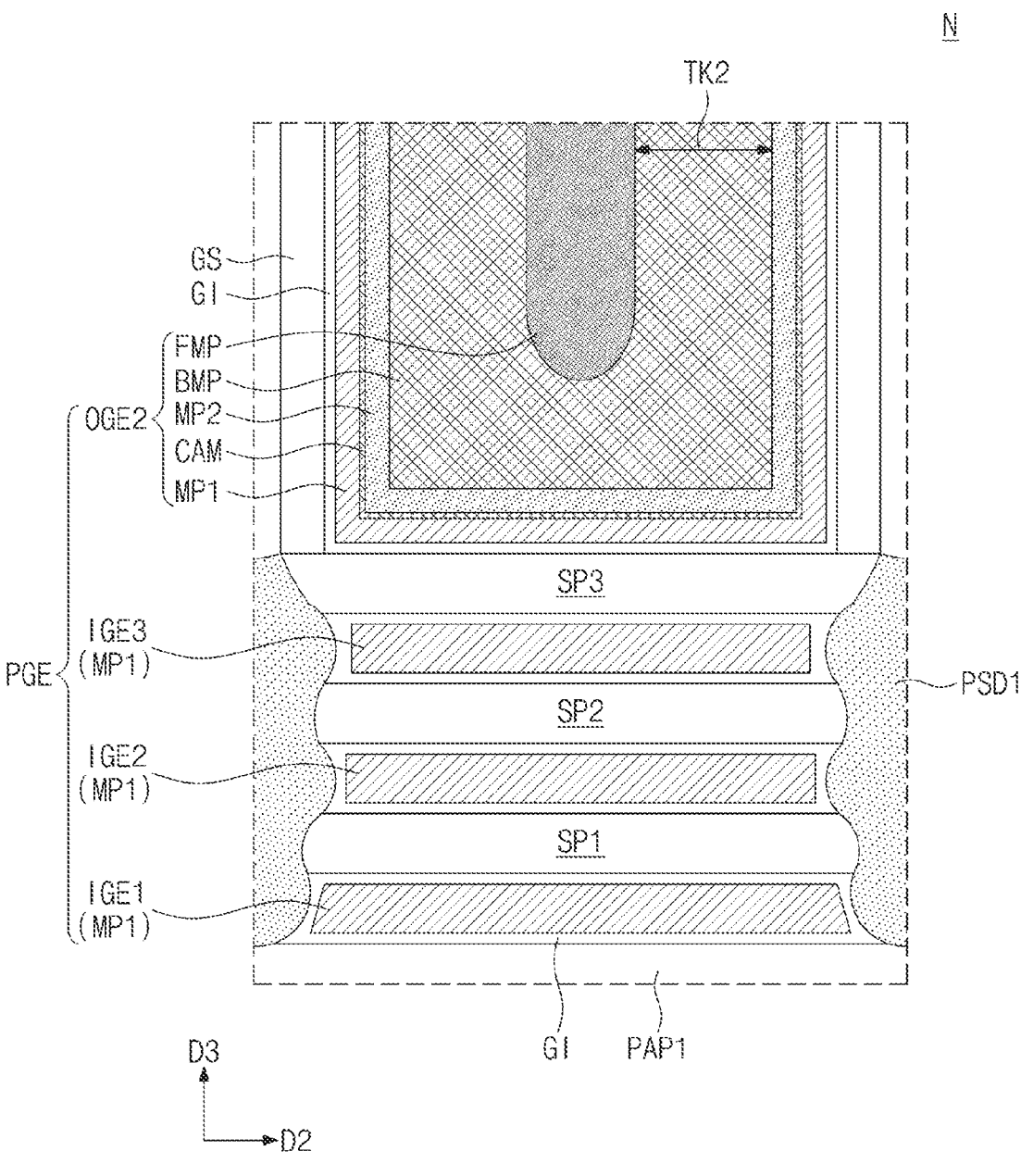
FIGS. 16B, 17B, and 18B are enlarged sectional views, each illustrating a method of forming the portion 'N' of FIG. 12D, according to the comparative example.
Figure 17A:
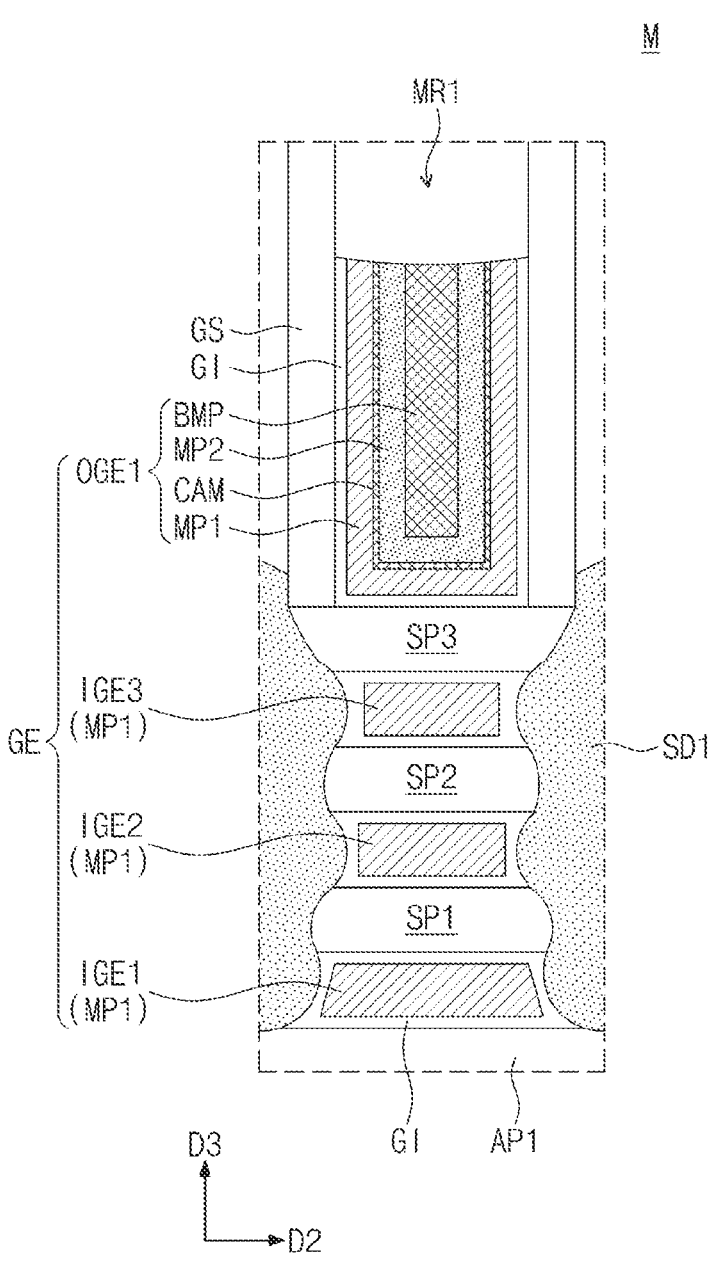
Figure 17B:
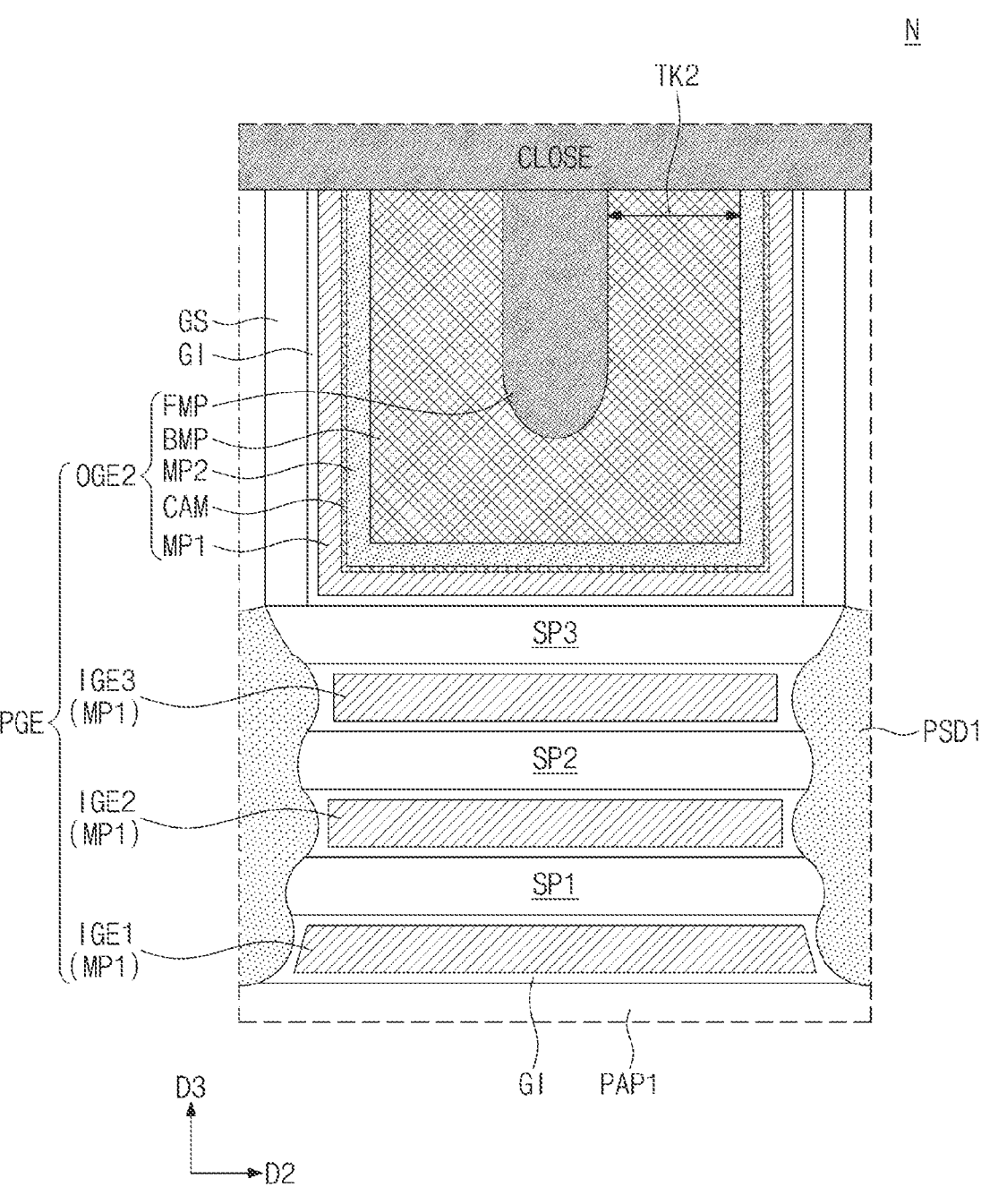
Figure 18A:
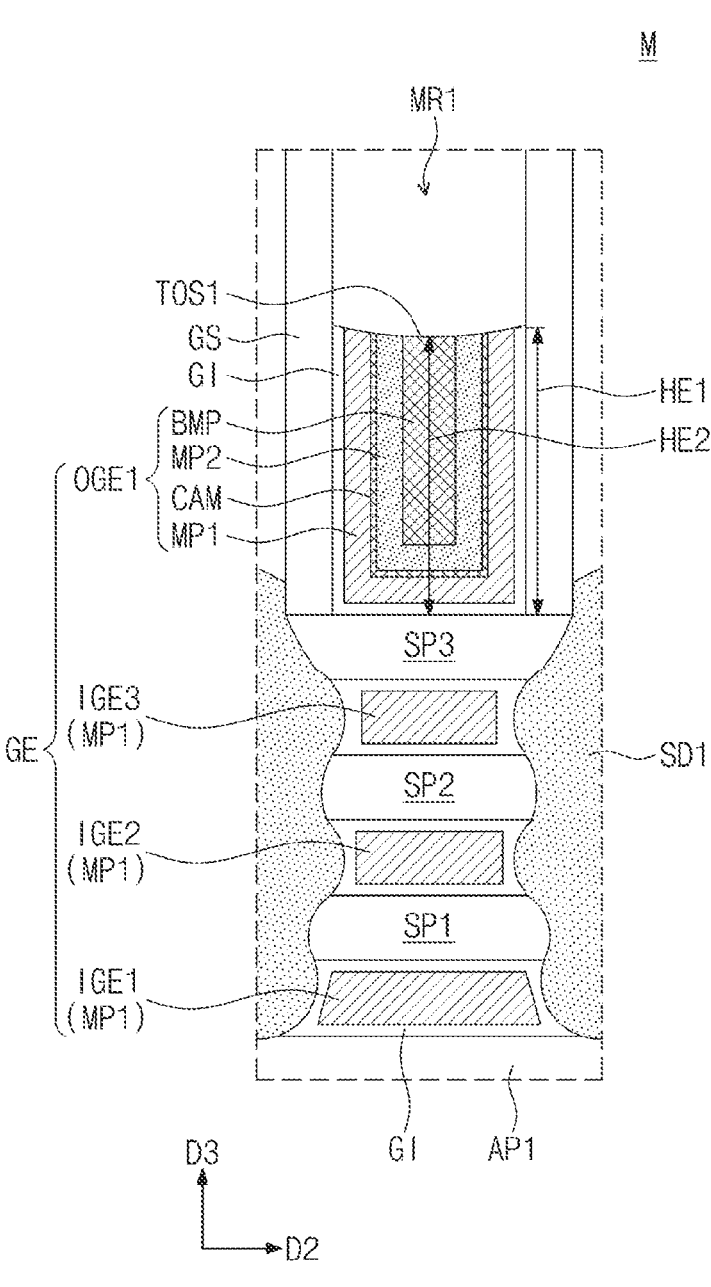
Figure 18B:
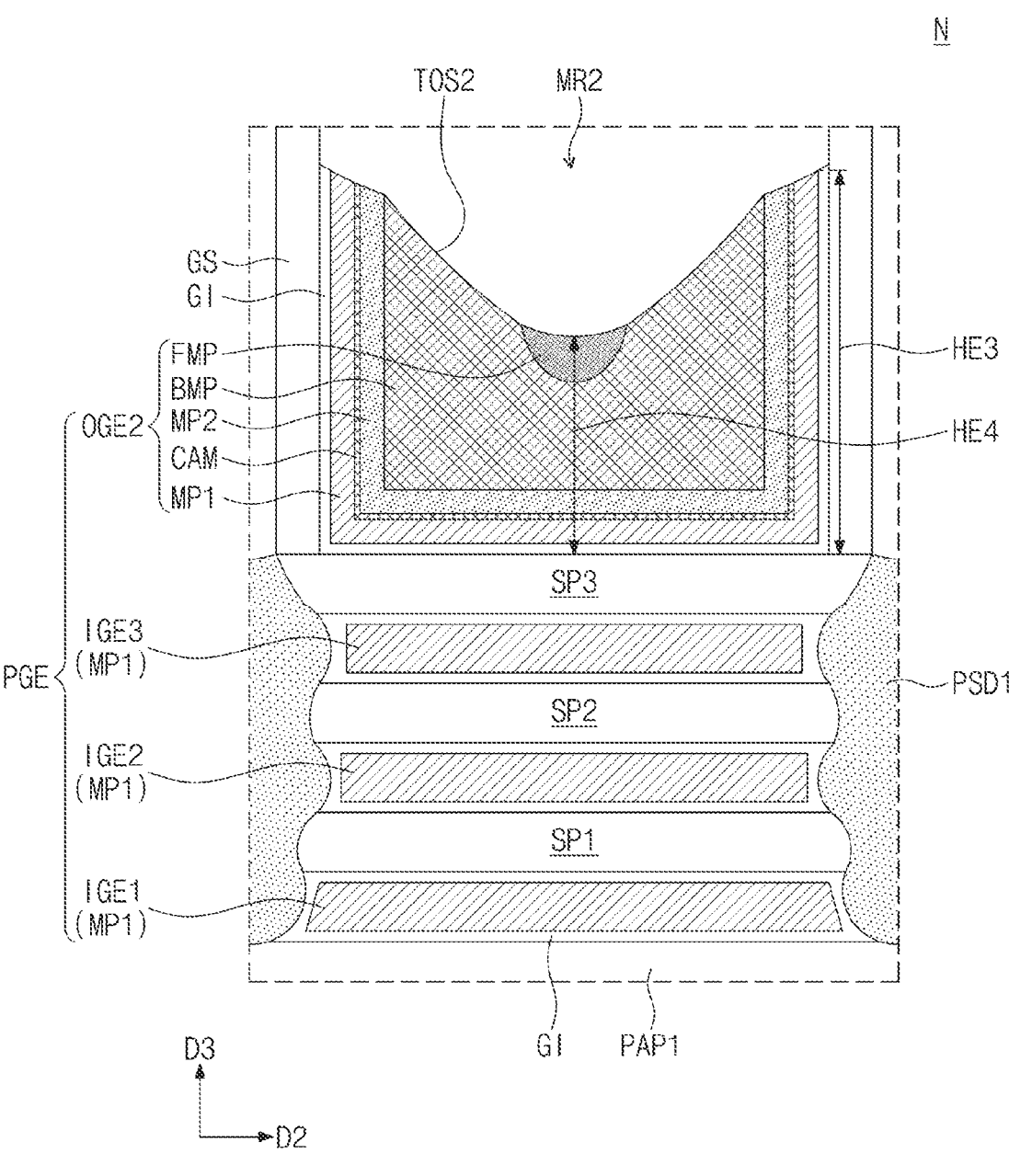

FIGS. 16A, 17A, and 18A are enlarged sectional views, each illustrating a method of forming the portion 'M' of FIG. 12A, according to a comparative example. FIGS. 16B, 17B, and 18B are enlarged sectional views, each illustrating a method of forming the portion 'N' of FIG. 12D, according to the comparative example.

Referring to FIGS. 16A and 16B, the gate insulating layer GI, the first metal pattern MP1, the capping pattern CAM, the second metal pattern MP2, and the barrier metal pattern BMP may be sequentially formed in the first and second outer regions ORG1 and ORG2. In the comparative example, the barrier metal pattern BMP may be formed to have a second thickness TK2. The second thickness TK2 may be smaller than the first thickness TK1 previously described with reference to FIG. 14B.

The fill metal pattern FMP may be further formed in a remaining empty space of the second outer region ORG2, which is not filled with the barrier metal pattern BMP. A volume of the fill metal pattern FMP in the second outer region ORG2 of FIG. 16B may be larger than a volume of the fill metal pattern FMP in the second outer region ORG2 of FIG. 14B.

Referring to FIGS. 17A and 17B, a close mask may be formed to cover the second region RG2 and expose the first region RG1, and then, a first metal etching process may be performed using the close mask. In this case, only the first outer electrode OGE1 may be selectively etched, and consequently, the first metal recess MR1 may be formed on only the first outer region ORG1 is narrower than the second outer region ORG2, an etch rate of a metal layer in the first outer region ORG1 is lower than that in the second outer region ORG2. The second region RG2 is blocked with the close mask to prevent excessive etching of the metal layer in the second outer region ORG2.

Referring to FIGS. 18A and 18B, the close mask on the second region RG2 may be removed to open both of the first and second regions RG1 and RG2. A second metal etching process may be performed on the first and second regions RG1 and RG2. As a result, the edge portion of the top surface TOS1 of the first outer electrode OGE1 may have the first height HE1. The edge portion of the top surface TOS2 of the second outer electrode OGE2 may have the third height HE3.

Meanwhile, the third height HE3 of the second outer electrode OGE2 in the present comparative example may be larger than the third height HE3 in the embodiment previously described with reference to FIG. 15B. This is because the metal etching process is insufficiently performed on the second outer electrode OGE2.

Meanwhile, since the edge portion of the second outer electrode OGE2 according to the present comparative example has the third height HE3, there may be a possibility of by-product generation from the edge portion of the second outer electrode OGE2 during the afore-described process of planarizing the gate capping pattern GP. For example, during the planarization process, the protruding edge portion of the second outer electrode OGE2 may be crashed to produce metallic by-products resembling particles, which may undesirably contaminate a neighboring region. The production of the metallic by-products may cause a serious process failure.

Figure 19:
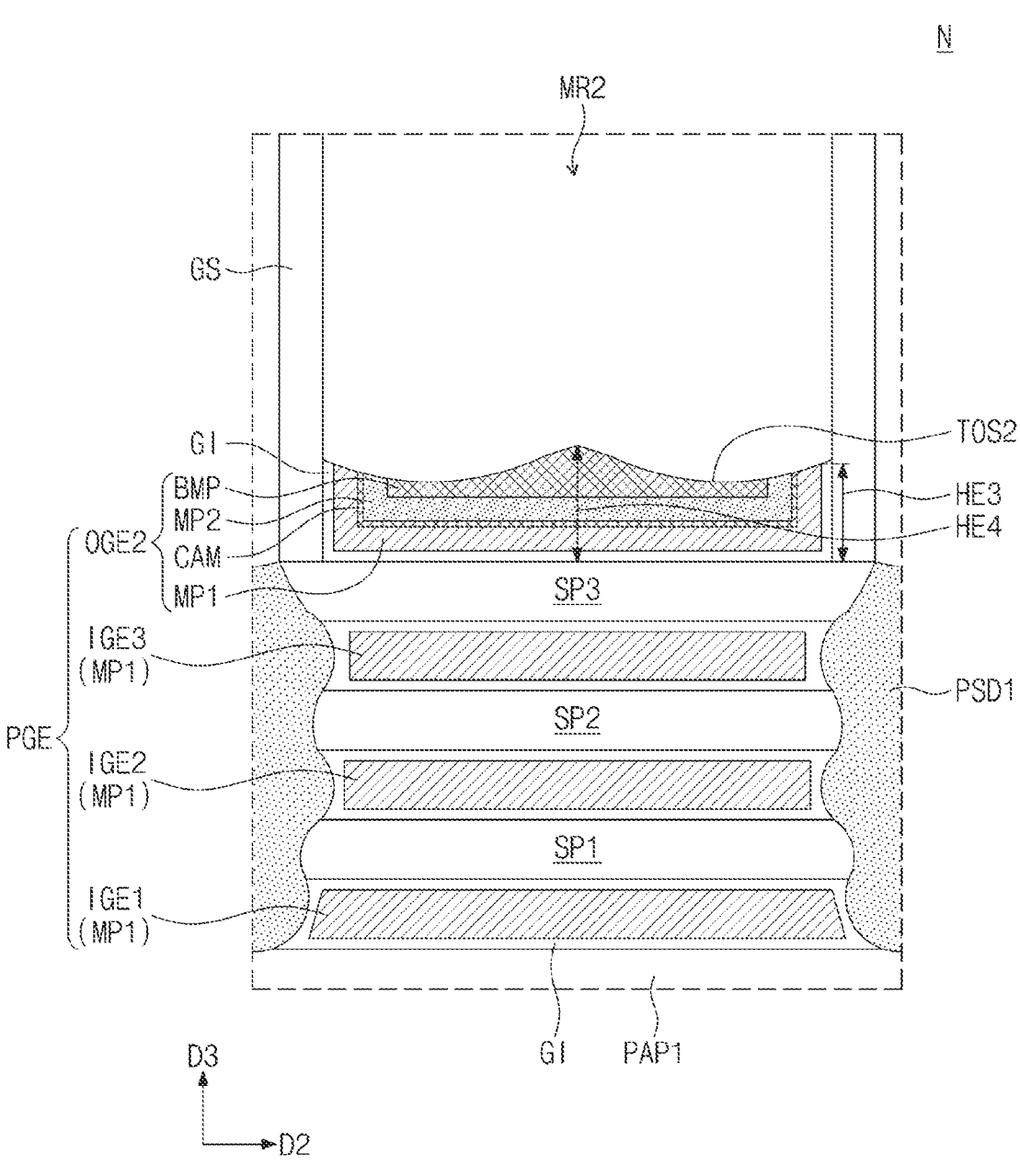
FIG. 19 is a sectional view corresponding to the portion 'N' of FIG. 12D, according to another comparative example.

FIG. 19 is a sectional view corresponding to the portion 'N' of FIG. 12D, according to another comparative example. Referring to FIG. 19, the close mask of FIG. 17B may be omitted from a region on the second outer electrode OGE2 previously described with reference to FIG. 16B, and the metal etching process of FIGS. 15A and 15B may be performed on both the first and second regions RG1 and RG2. As a result, the top surface TOS2 of the second outer electrode OGE2 may be formed to have a very small height. For example, the height HE3 of the edge portion of the top surface TOS2 of the second outer electrode OGE2 may be much smaller than the first height HE1 of FIG. 15A. In this case, a process failure may occur; for example, the gate contact GC may not be normally coupled to the second outer electrode OGE2.

Figure 20:
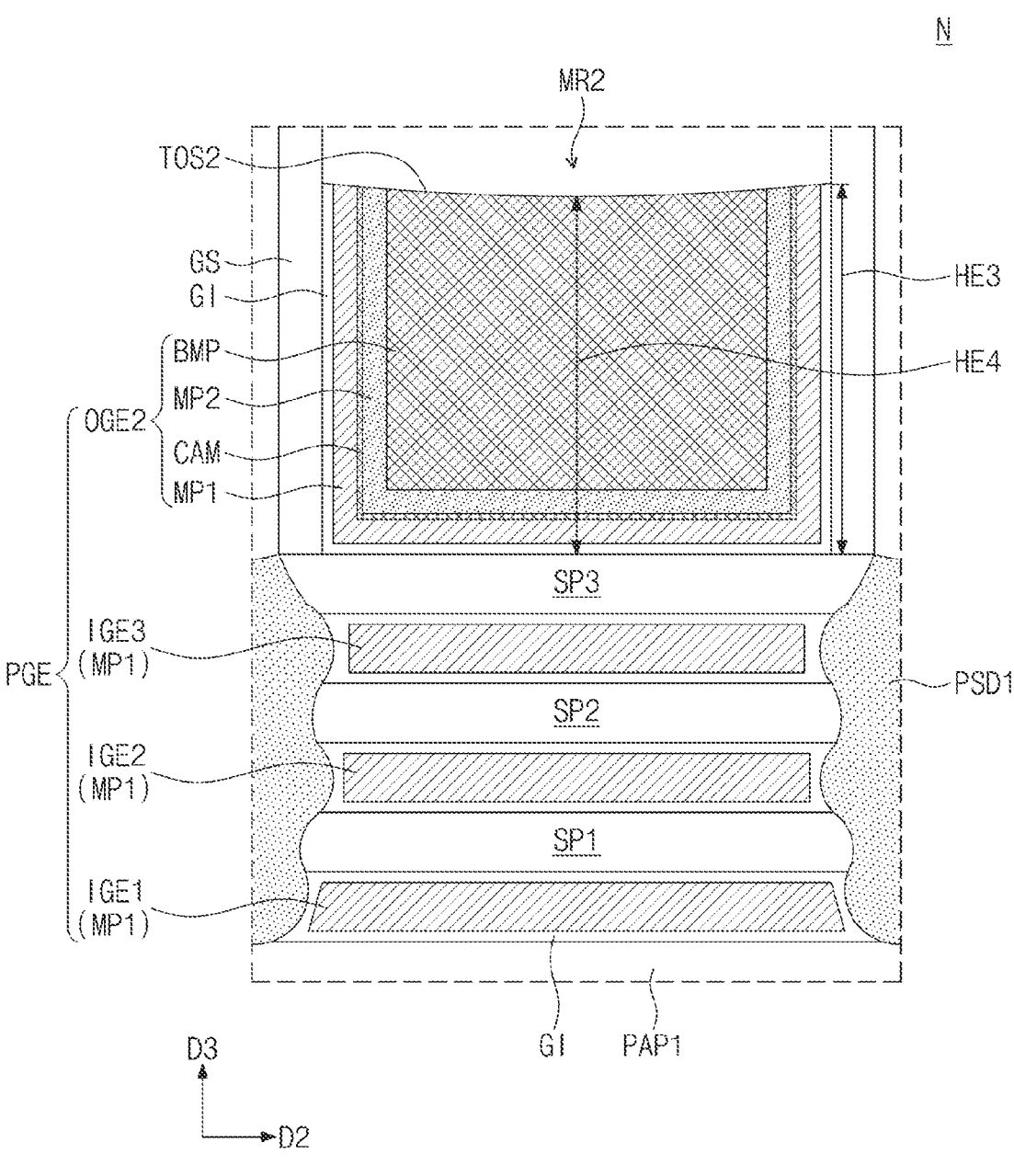
FIG. 20 is a sectional view corresponding to the portion 'N' of FIG. 12D, according to still other comparative example.

FIG. 20 is a sectional view corresponding to the portion 'N' of FIG. 12D, according to still other comparative example. Referring to FIG. 20, the fill metal pattern FMP may be excluded from the second outer electrode OGE2, which is mainly composed of the barrier metal pattern BMP. The metal etching process of FIGS. 15A and 15B may be performed on both the first and second regions RG1 and RG2. As a result, the top surface TOS2 of the second outer electrode OGE2 may be formed to have a very large height. For example, the height HE3 of the edge portion of the top surface TOS2 of the second outer electrode OGE2 may be much larger than the third height HE3 of FIG. 15B. Even in this case, a process failure, such as the production of metallic by-products, may occur during the planarization process previously described with reference to FIG. 18B.

By contrast, according to an embodiment of the inventive concept, the barrier metal pattern BMP in the second outer electrode OGE2 may be formed to have an optimized thickness (i.e., the first thickness TK1), and thus, the height HE3 of the second outer electrode OGE2 may be controlled to have a value, which is similar to the height HE1 of the first outer electrode OGE1, through a single process without a mask closing step. In an embodiment, the first thickness TK1 may be in a range from about 20 nm to about 24 nm but may be changed depending on a linewidth of the second outer electrode OGE2 and a thickness of other metal pattern in the second outer electrode OGE2. According to an embodiment of the inventive concept, it may be possible to increase the efficiency in the process of fabricating a semiconductor device and to reduce a process failure.

Figure 21:
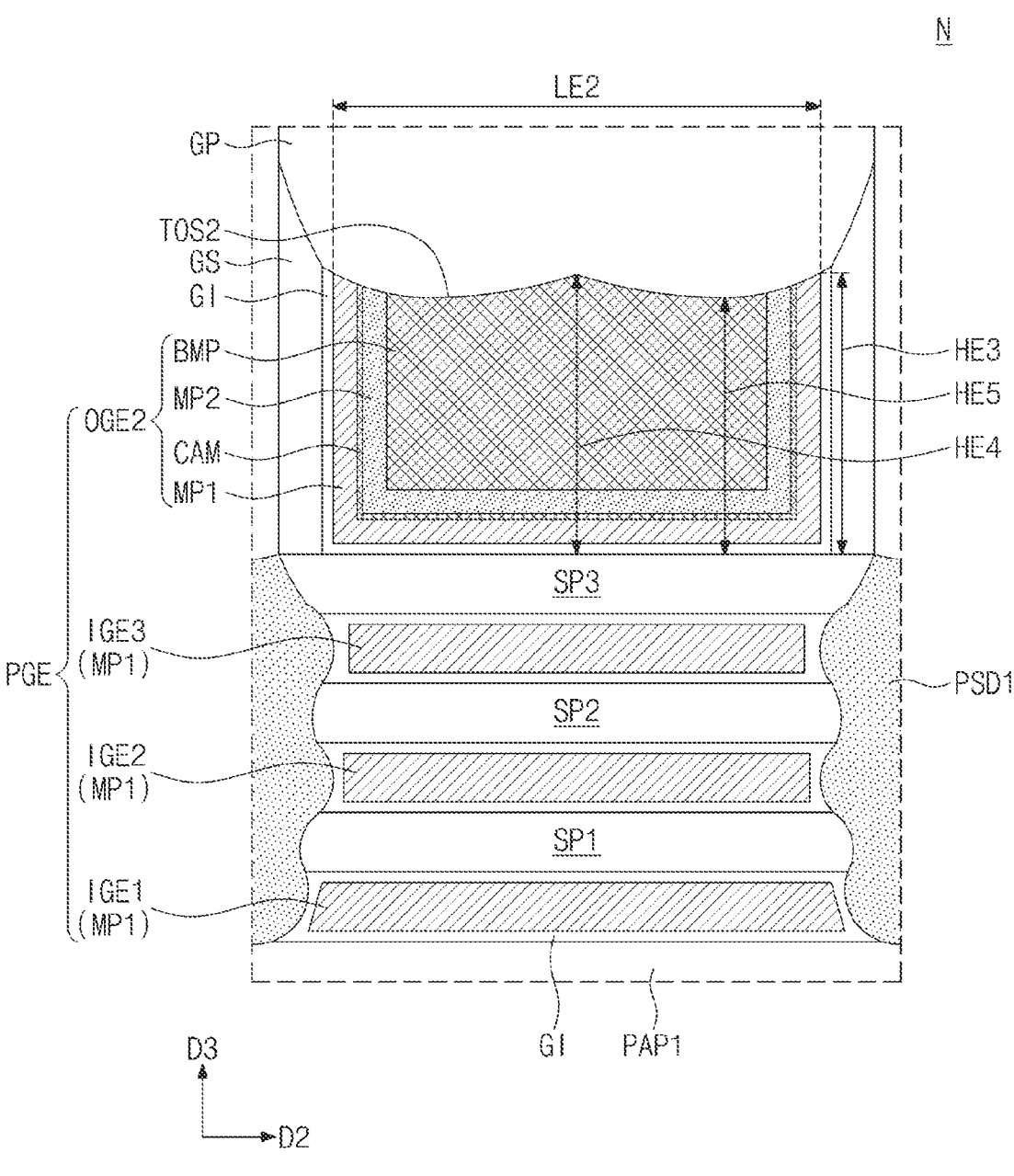
FIG. 21 is an enlarged sectional view illustrating the portion 'N' of FIG. 5E, according to another embodiment of the inventive concept.
Figure 22:
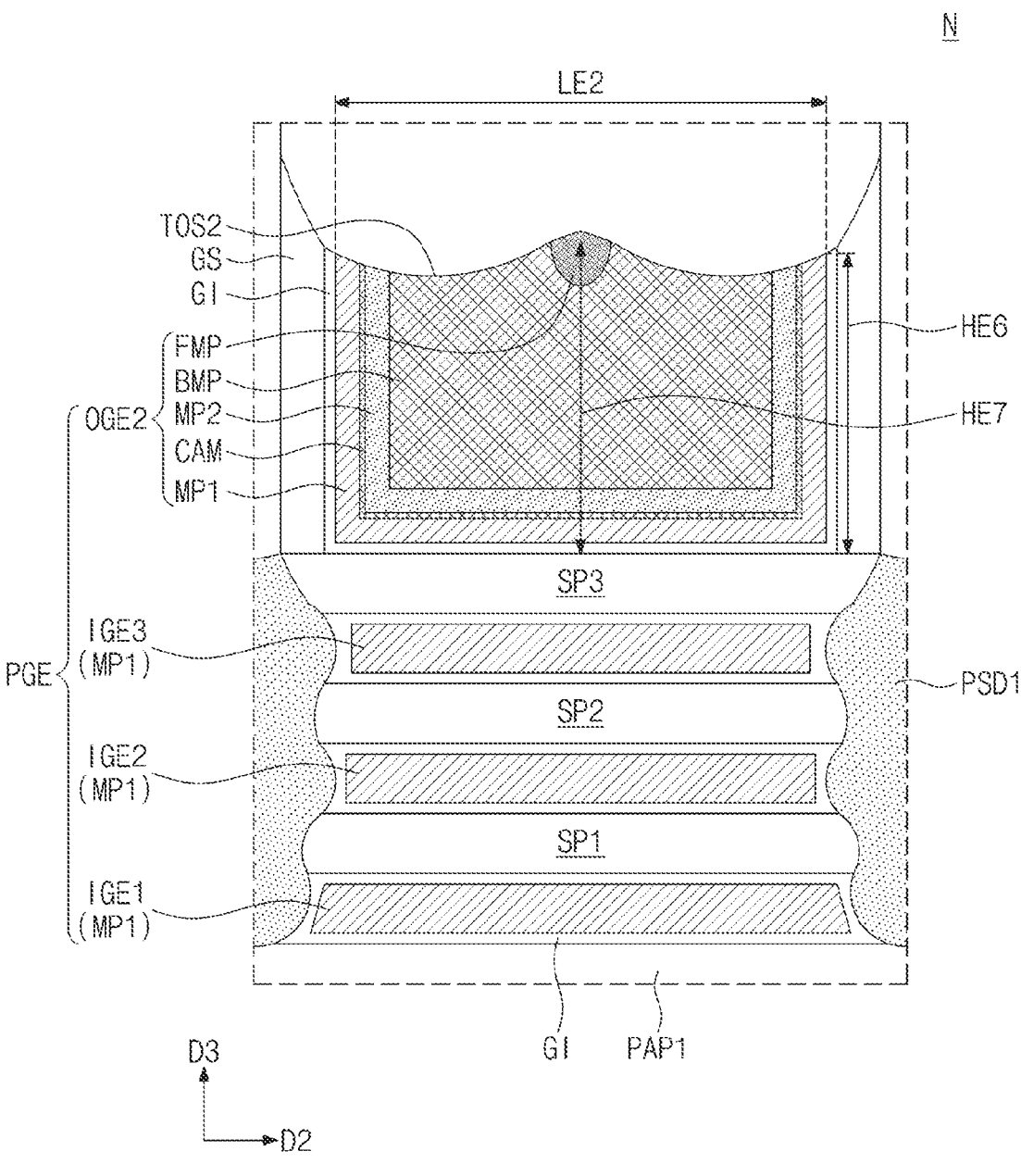
FIG. 22 is an enlarged sectional view illustrating a portion (e.g., a peripheral gate electrode on a second peripheral active region) of a semiconductor device according to still other embodiment of the inventive concept.

FIG. 21 is an enlarged sectional view illustrating the portion 'N' of FIG. 5E, according to another embodiment of the inventive concept. FIG. 22 is an enlarged sectional view illustrating a portion (e.g., a peripheral gate electrode on a second peripheral active region) of a semiconductor device according to still other embodiment of the inventive concept. For concise description, an element previously described with reference to FIGS. 4 to 6B may be identified by a similar or identical reference number without repeating an overlapping description thereof.

Referring to FIG. 21, the fill metal pattern FMP may be omitted from the second outer electrode OGE2. For example, the second outer electrode OGE2 may be tungsten-free. Both of the first and second outer electrodes OGE1, OGE2 can be tungsten-free. The center portion of the second outer electrode OGE2 may be completely filled with the barrier metal pattern BMP, similar to the first outer electrode OGE1 of FIG. 6A. The fill metal pattern FMP may be fully removed by the second dry etching process previously described with reference to FIGS. 15A and 15B.

The fourth height HE4 of the second outer electrode OGE2 may be smaller than the fourth height HE4 previously described with reference to FIG. 6B. The fourth height HE4 of the second outer electrode OGE2 may be smaller than the third height HE3. A ratio HE3/HE4 of the third height HE3 to the fourth height HE4 may be in a range from about 1 to about 1.2. The fourth height HE4 of the second outer electrode OGE2 may be larger than the fifth height HE5.

Referring to FIG. 22, the second outer electrode OGE2 on the second peripheral channel pattern PCH2 may have the second length LE2. The second length LE2 may be substantially equal to the second length LE2 of FIG. 6B. In an embodiment, the second outer electrode OGE2 on the second peripheral channel pattern PCH2 may include the first metal pattern MP1, the capping pattern CAM, the second metal pattern MP2, and the barrier metal pattern BMP, which are sequentially stacked. In an embodiment, a thickness of the first metal pattern MP1 of FIG. 22 may be different from the thickness of the first metal pattern MP1 of FIG. 6B. A thickness of the second metal pattern MP2 of FIG. 22 may be different from the thickness of the second metal pattern MP2 of FIG. 6B.

An edge portion of the second outer electrode OGE2 on the second peripheral channel pattern PCH2 may have a sixth height HE6. A center portion of the second outer electrode OGE2 on the second peripheral channel pattern PCH2 may have a seventh height HE7. In an embodiment, the sixth height HE6 may be larger than the third height HE3 of FIG. 6B. The seventh height HE7 may be larger than the fourth height HE4 of FIG. 6B.

According to an embodiment of the inventive concept, a height of a first gate electrode of a short channel transistor may be controlled to be similar to a height of a second gate electrode of a long channel transistor. Thus, gate contacts may be stably connected to the first and second gate electrodes, respectively, and as a result, the reliability of the semiconductor device may be improved. Furthermore, a top surface of the second gate electrode may be formed to have a 'W'-shaped profile, not a 'V'-shaped profile, and thus, it may be possible to improve the uniformity in height of the top surface of the second gate electrode.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including a first region and a second region;
an active region on the first region;
a peripheral active region on the second region;
a channel pattern on the active region, the channel pattern comprising a plurality of first semiconductor patterns, which are stacked and spaced apart from each other;
a peripheral channel pattern on the peripheral active region, the peripheral channel pattern comprising a plurality of second semiconductor patterns, which are stacked and spaced apart from each other;
a gate electrode on the channel pattern, wherein the gate electrode comprises a first inner electrode between the first semiconductor patterns and a first outer electrode on an uppermost one of the first semiconductor patterns; and
a peripheral gate electrode on the peripheral channel pattern,
wherein the peripheral gate electrode comprises a second inner electrode between the second semiconductor patterns and a second outer electrode on an uppermost one of the second semiconductor patterns,
a linewidth of the second outer electrode is larger than a linewidth of the first outer electrode,
an edge portion of a top surface of the first outer electrode has a first height,
an edge portion of a top surface of the second outer electrode has a second height,
a difference between the second height and the first height is smaller than about 10 nm, and
the top surface of the second outer electrode has a doubly-concave shape.

2. The semiconductor device of claim 1, wherein each of the first and second outer electrodes comprises a first metal pattern, a capping pattern, a second metal pattern, and a barrier metal pattern, which are sequentially stacked.

3. The semiconductor device of claim 2, wherein the barrier metal pattern comprises titanium nitride.

4. The semiconductor device of claim 2, wherein the first metal pattern comprises a p-type work function metal, and the second metal pattern comprises an n-type work function metal.

5. The semiconductor device of claim 2, wherein the second outer electrode further comprises a fill metal pattern provided in an upper portion of the barrier metal pattern vertically and in a center portion thereof horizontally.

6. The semiconductor device of claim 5, wherein the fill metal pattern comprises tungsten.

7. The semiconductor device of claim 2, wherein both of the first and second outer electrodes are tungsten-free.

8. The semiconductor device of claim 1, wherein a center portion of the top surface of the second outer electrode has a third height, and
a ratio of the third height to the second height is in a range from about 1 to about 1.2.

9. The semiconductor device of claim 8, wherein the top surface of the second outer electrode between the center and edge portions has a fourth height,
the second height is larger than the fourth height, and
the third height is larger than the fourth height.

10. The semiconductor device of claim 1, wherein a center portion of the top surface of the first outer electrode has a third height, and
a ratio of the third height to the first height is in a range from about 0.8 to about 1.

11. A semiconductor device, comprising:
a substrate including a peripheral active region;
a peripheral channel pattern on the peripheral active region, the peripheral channel pattern comprising a plurality of semiconductor patterns, which are stacked and spaced apart from each other; and
a peripheral gate electrode on the peripheral channel pattern,
wherein the peripheral gate electrode comprises an inner electrode between the semiconductor patterns and an outer electrode on an uppermost one of the semiconductor patterns,
a linewidth of the outer electrode is in a range from about 50 nm to about 100 nm, an edge portion of a top surface of the outer electrode has a first height, a center portion of the top surface of the outer electrode has a second height, the top surface of the outer electrode has a third height, between the center and the edge portions, the first height is larger than the third height, the second height is larger than the third height, and a difference between the first height and the second height is smaller than about 10 nm.

12. The semiconductor device of claim 11, wherein the outer electrode comprises a first metal pattern, a capping pattern, a second metal pattern, and a barrier metal pattern, which are sequentially stacked, and the barrier metal pattern serves as a center portion of the outer electrode.

13. The semiconductor device of claim 12, wherein the outer electrode is tungsten-free.

14. The semiconductor device of claim 11, wherein the top surface of the outer electrode has a doubly-concave shape.

15. The semiconductor device of claim 11, wherein a ratio of the first height to the second height is in a range from about 1 to about 1.2.

16. A semiconductor device, comprising:

a substrate including a peripheral active region;

a device isolation layer filling a trench defining the peripheral active region;

a peripheral channel pattern on the peripheral active region, the peripheral channel pattern comprising a plurality of semiconductor patterns, which are stacked to be spaced apart from each other;

a peripheral source/drain pattern provided on the peripheral active region and connected to the semiconductor patterns;

a peripheral gate electrode on the peripheral channel pattern, the peripheral gate electrode comprising an inner electrode between the semiconductor patterns and an outer electrode on the uppermost semiconductor pattern of the semiconductor patterns;

a gate insulating layer between the peripheral channel pattern and the peripheral gate electrode;

a gate spacer on a side surface of the outer electrode;

a gate capping pattern on a top surface of the outer electrode;

an active contact coupled to the peripheral source/drain pattern;

a gate contact coupled to the peripheral gate electrode; and a first metal layer on the active contact and the gate contact, wherein interconnection lines in the first metal layer are electrically connected to the active contact and the gate contact, respectively, a linewidth of the outer electrode is in a range from about 50 nm to about 100 nm, an edge portion of the top surface of the outer electrode has a first height in a range from about 20 nm to about 40 nm, and the top surface of the outer electrode has a doubly-concave shape.

17. The semiconductor device of claim 16, wherein the outer electrode comprises a first metal pattern, a capping pattern, a second metal pattern, and a barrier metal pattern, which are sequentially stacked, and the barrier metal pattern serves as a center portion of the outer electrode.

18. The semiconductor device of claim 17, wherein the barrier metal pattern comprises titanium nitride.

19. The semiconductor device of claim 17, wherein the outer electrode is tungsten-free.

20. The semiconductor device of claim 16, wherein a center portion of the top surface of the outer electrode has a second height, and a ratio of the first height to the second height is in a range from about 1 to about 1.2.

* * * * *